United States Patent
Yamada et al.

(10) Patent No.: US 7,279,253 B2
(45) Date of Patent: Oct. 9, 2007

(54) NEAR-FIELD LIGHT GENERATING STRUCTURE, NEAR-FIELD EXPOSURE MASK, AND NEAR-FIELD GENERATING METHOD

(75) Inventors: Tomohiro Yamada, Yokohama (JP); Ryo Kuroda, Kawasaki (JP); Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 253 days.

(21) Appl. No.: 10/936,806

(22) Filed: Sep. 9, 2004

(65) Prior Publication Data

US 2005/0064303 A1    Mar. 24, 2005

(30) Foreign Application Priority Data

Sep. 12, 2003  (JP)  ............................ 2003-321227
Sep. 16, 2003  (JP)  ............................ 2003-323252

(51) Int. Cl.
    *G03F 1/00*     (2006.01)
(52) U.S. Cl. .......................................... 430/5; 430/396
(58) Field of Classification Search ........ 250/234–236, 250/306, 307; 430/5, 396
    See application file for complete search history.

(56) References Cited

U.S. PATENT DOCUMENTS

| | | | |
|---|---|---|---|
| 5,508,527 A | 4/1996 | Kuroda et al. | 250/491.1 |
| 6,171,730 B1 | 1/2001 | Kuroda et al. | 430/5 |
| 6,187,482 B1 | 2/2001 | Kuroda et al. | 430/5 |
| 6,559,926 B2 | 5/2003 | Yamaguchi et al. | 355/53 |
| 6,628,392 B2 | 9/2003 | Kuroda et al. | 356/400 |
| 6,632,593 B2 | 10/2003 | Yamaguchi et al. | 430/322 |
| 6,720,115 B2 | 4/2004 | Inao et al. | 430/5 |
| 2002/0071106 A1 | 6/2002 | Yano et al. | 355/53 |
| 2003/0211403 A1 | 11/2003 | Mizutani et al. | 430/5 |
| 2004/0080732 A1 | 4/2004 | Kuroda et al. | 355/53 |
| 2004/0121245 A1 | 6/2004 | Inao et al. | 430/5 |
| 2004/0137338 A1* | 7/2004 | Inao et al. | 430/5 |
| 2004/0166421 A1 | 8/2004 | Yamaguchi et al. | 430/5 |

FOREIGN PATENT DOCUMENTS

JP          8-179493        7/1996

OTHER PUBLICATIONS

Binning, G., et al. "Surface Studies by Scanning Tunneling Microscopy," *Physical Review Letters*, vol. 49, No. 1, Jul. 5, 1982. pp. 57-61.

* cited by examiner

*Primary Examiner*—Thanh X. Luu
*Assistant Examiner*—Suezu Ellis
(74) *Attorney, Agent, or Firm*—Fitzpatrick, Cella, Harper & Scinto

(57) ABSTRACT

A near-field exposure mask includes a mask base material and a light blocking layer formed on the base material, the light blocking layer includes a fine metal structure or fine opening formed in the light blocking layer. The size of the metal structure or the size of the opening is not more than a wavelength of light for exposure, and at least one of a cross section of the fine metal structure in a direction perpendicular to a surface of the mask, and a cross section of the fine opening in a direction perpendicular to the mask surface has an asymmetrical sectional shape with respect to an arbitrary axis perpendicular to the mask surface.

13 Claims, 17 Drawing Sheets

NEAR-FIELD LIGHT GENERATING STRUCTURE, NEAR-FIELD EXPOSURE MASK, AND NEAR-FIELD GENERATING METHOD

FIELD OF THE INVENTION AND RELATED ART

The present invention relates to a near-field light generating structure, a near-field exposure mask, a near-field generating method, and a near-field recording and reproducing apparatus.

Increasing capacity of a semiconductor memory and increasing speed and density of a CPU processor have inevitably necessitated further improvements in the fineness of microprocessing through optical lithography. Generally, the limit of microprocessing with an optical lithographic apparatus is on an order of the wavelength of the light being used. Thus, the wavelength of light used in optical lithographic apparatuses has been shortened more and more. Currently, a near ultraviolet laser is used, and microprocessing of a 0.1 μm order is enabled. While the fineness is being improved in the optical lithography, in order to assure microprocessing of 0.1 μm or narrower, there still remain many unsolved problems, such as further shortening of the wavelength of the laser light, development of lenses usable in such a wavelength region, and the like.

On the other hand, as a means for enabling microprocessing of 0.1 μm or narrower, a microprocessing apparatus, using a near-field optical microscope (scanning near-field optical microscope: SNOM), has been proposed. An example is an exposure apparatus in which, by use of near-field light leaking from a fine slit of a size not greater than 100 nm, local exposure that exceeds the light wavelength limit is performed to a resist.

However, such a lithographic apparatus with an SNOM structure is arranged to execute the microprocessing by use of one or more processing probes, as in continuous drawing. Thus, there is a problem that the throughput is not high.

As one method for solving such a problem, Japanese Laid-Open Patent Application (JP-A) No. Hei 08-179493 proposes a method that a photomask with an opening pattern having a size of not more than a wavelength of light is provided with a prism, the light is caused to enter the photomask at an angle causing total reflection, and a pattern of the photomask is simultaneously transferred to a resist by use of evanescent light leaking from the total reflection surface.

In the case wherein near-field light is generated by using a fine opening described in the above-described document, JP-A Hei 08-179493, an improvement in generation efficiency thereof is further desired. Further, it is difficult to generate a strong electrical field at a desired position, so that a desired exposure pattern is not necessarily obtained satisfactorily.

In recent years, a scanning tunnel microscope (STM) permitting direct observation of an electronic structure of a surface atom of a conductor has been developed (G. Binning, et al., Phys. Rev. Lett., 49, 57 (1983)). Since it has become possible to measure a real-space image at a high resolution irrespective of whether a measuring material is a monocrystalline one or an amorphous one, a scanning probe microscope (SPM) has been studied actively in the field of material microstructure evaluation. As the SPM, it is possible to use microscopes utilizing a tunnel current (i.e., STM), an atomic force (i.e., an atomic force microscope (AFM)), a magnetic force (i.e., a magnetic force microscope (MFM)), and near-field light (i.e., a scanning near-field optical microscope (SNOM)), which are obtained by bringing a probe means having a microprobe (probe) near to a sample to be evaluated.

In these SPMs, the SNOM permits measurement of a fine pattern shape, or the like, on the sample surface at a high resolution in a nondestructive manner with respect to a positional resolution of not more than $\lambda/2$, which has not been realized by a conventional optical microscope. In such a SNOM, it becomes possible to employ a material, which has been difficult to be observed conventionally, such as an ecological material or a cell. Accordingly, the SNOM permits observation of a lot of materials and is capable of a wide application.

With respect to the SNOM, not only has surface observation using near-field light generated from a fine opening, but also, studies on exposure and application to other techniques have been made extensively.

In the case wherein the near-field light is generated in a strong electrical field by use of a fine opening described in the above-mentioned document, JP-A Hei 08-179493, high intensity near-field light is not necessarily generated satisfactorily.

SUMMARY OF THE INVENTION

An object of the present invention is to provide a near-field exposure mask permitting efficient generation of intense near-field light at a desired position, and its manufacturing method.

Another object of the present invention is to provide a near-field light generating structure, which can provide near-field light improved in intensity, and is capable of suppressing an expanse of a near-field generation area to a low level.

A further object of the present invention is to provide a near-field optical head using the near-field light generating structure, a near field recording and reproducing apparatus using the near-field optical head, and a surface observation apparatus using the near-field optical head.

According to the present invention, there is provided a near-field light generating structure, for generating near-field light, having a pattern of a fine metal structure, comprising a light blocking layer or a pattern of a fine opening provided in the light blocking layer, the fine metal structure or the fine opening having a size of not more than a wavelength of incident light, wherein the fine metal structure or the fine opening has a sectional shape, in a plane parallel with the incident light, which is asymmetrical in terms of a member adjacent to the fine metal structure or the fine opening.

Herein, the term "asymmetrical" in the near-field light generating structure means, e.g., that a mask base material and a fine metal structure are placed in a state as shown in FIG. 1(a) or 1(b) or that a grating 101 and a metal piece 106 are placed in a state as shown in FIG. 8.

According to a first aspect of the present invention, there is provided, as the near-field light generating structure, a near-field exposure mask having a pattern of a fine metal structure, comprising a mask base material and a light blocking layer or a pattern of a fine opening provided in the light blocking layer, the fine metal structure or the fine opening having a size of not more than a wavelength of light for exposure, wherein at least one of a cross section of the fine metal structure in a direction perpendicular to a surface of the mask and a cross section of the fine opening in a direction perpendicular to the mask surface has an asymmetrical sectional shape with respect to an arbitrary axis perpendicular to the mask surface.

The near-field exposure mask may preferably have such a structure that the light for exposure is incident from a first surface side of the mask and an optical electrical field is generated from a second surface side of the mask, and the asymmetrical sectional shape of the near-field exposure mask has at least one acute vertex in the neighborhood of the second surface side of the mask. In this case, the asymmetrical sectional shape may preferably have three vertexes including first and second vertexes in the neighborhood of the first surface side and a third vertex in the neighborhood of the second surface side.

The asymmetrical sectional shape of the near-field exposure mask may preferably be a substantially polygonal shape selected from the group consisting of a substantial triangle, a substantial rectangle, and a substantial parallelogram. In the case of the triangular sectional shape, the triangle may preferably have first to third vertexes in which an interior angle of the first vertex or the second vertex is not less than ninety degrees.

A near-field exposure mask generating method according to the present invention comprises using any one of the near-field exposure masks described above, and creating at least one of electrical field concentration, interference of surface plasmon polariton waves, and plasma oscillation in an asymmetrical system including the asymmetrical sectional shape, to generate intense near-field light in the neighborhood of an acute vertex of the asymmetrical sectional shape of the mask.

In the near-field light generating method of the present invention, the interference of surface plasmon polariton waves may preferably be created so that a difference in effective propagation distance between a surface plasmon polariton wave propagated from one side in the asymmetrical system and a surface plasmon polariton wave propagated from the other side opposite from the one side is an odd integral of a substantial half-wavelength of the surface plasmon polariton wave.

In the near-field light generating method of the present invention, the intense near-field light may preferably be generated in the neighborhood of the acute vertex of the asymmetrical sectional shape of the mask by the plasma oscillation.

According to the present invention, there is further provided a near-field exposure mask manufacturing method for manufacturing at least one near-field exposure mask having a pattern portion which comprises a fine metal structure, formed on a mask base material, having a size of not more than a wavelength of light for exposure or a plurality of fine openings, formed in a light blocking layer on the mask base material, each having a size of not more than the wavelength of light for exposure, the method comprising a step of forming a cross section, of the fine metal structure or the light blocking layer between adjacent fine openings, perpendicular to a surface of the mask, in an asymmetrical shape.

In the near-field exposure mask manufacturing method, the step of forming the asymmetrical sectional shape may preferably comprise a step of forming a light blocking metal layer, a step of forming an etching mask layer, and a step of etching the light blocking metal layer through the etching mask layer so that the etching is performed at a certain angle with respect to a normal to the etching mask layer surface. Further, the asymmetrical sectional shape forming step may also preferably comprise a step of forming a light blocking metal layer, a step of forming an etching mask layer, a step of processing the etching mask layer so that a sectional shape of the etching mask layer is cut in a plane including a normal to the light blocking metal layer surface, and a step of etching the light blocking metal layer through the etching mask layer.

In a preferred embodiment, the asymmetrical sectional shape forming step of the near-field exposure mask manufacturing method comprises a step of forming the light blocking metal layer, a step of forming the etching mask layer, and a step of patterning the etching mask layer by irradiating an exposure mask for generating near-field light with exposure light at a certain angle with respect to a normal to the exposure mask. The asymmetrical sectional shape forming step may also preferably comprise a step of forming the light blocking metal layer, and a step of processing the light blocking metal layer by use of a light beam having an intense distribution which has no symmetry axis of rotation parallel with a normal to the light blocking metal layer surface. The asymmetrical sectional shape forming step may further preferably comprise a step of forming the light blocking metal layer, and a step of processing the light blocking metal layer by use of a light beam at a certain angle with respect to a normal to the surface of the light blocking metal layer.

A near-field exposure apparatus according to the present invention comprises any one of the near-field exposure masks described above, a member to be exposed, and an exposure light source.

A near-field exposure method according to the present invention comprises a step of exposing a member to be exposed to light by irradiating any one of the near-field exposure masks described above with light for exposure or by generating intense near-field light in the neighborhood of an acute vertex of an asymmetrical sectional shape of the mask by use of any one of the near-field light generating methods described above.

A fine device manufacturing method according to the present invention comprises a step of using the near-field exposure apparatus or method described above to manufacture a fine device.

According to a second aspect of the present invention, there is provided a near-field light generating structure, comprising:

a light blocking metal layer comprising a fine opening having a size of not more than a wavelength of polarization-controlled light incident from a light source and a metal piece disposed in the fine opening, wherein the metal piece has a sectional shape, in a plane including a plane of polarization of the incident light, which is asymmetrical with respect to a center line of the fine opening.

In the present invention, there is also provided a near-field light generating structure, comprising:

a light blocking metal layer comprising a fine opening having a size of not more than a wavelength of polarization-controlled light incident from a light source and a metal piece disposed in the fine opening, wherein the light blocking metal layer has a periodic surface unevenness for exciting a surface plasmon polariton wave and a fine opening formed at a center position where a sectional shape of the periodic surface unevenness in a plane including a plane of polarization of the incident light or at a position shifted from the center position in a direction including a plane of polarization of the incident light, and wherein a metal piece having an asymmetrical sectional shape with respect to a center line of the fine opening in a plane including a plane of polarization of the incident light when the fine opening is formed at the center position or a metal piece having a symmetrical or an asymmetrical sectional shape with respect to the center line of the fine opening in the plane when the fine opening is formed at the position shifted from the center position.

In the near-field light generating structure of the present invention, the periodic surface unevenness of the light blocking metal layer may preferably have a period substantially equal to a wavelength of a surface plasmon polariton wave excited at the surface of the light blocking metal layer.

In the near field light generating structure according to the present invention, the periodic surface unevenness may preferably have a phase difference α represented by the following equation (1):

$$\alpha = (a-b)/\Lambda \times 2\pi \quad (1),$$

wherein a represents a distance between an end surface and a starting point of a period structure on one side with respect to a center line of the fine opening, b represents a distance between an end surface and a starting point of a period structure on the other side with respect to the center line of the fine opening, and Λ represents a pitch of the periodic surface unevenness.

In the near-field light generating structure according to the present invention, the metal piece may preferably have first and second vertexes in the neighborhood of a light-incident surface and a third vertex in the neighborhood of a surface, opposite from the light-incident surface, where an optical electrical field is created, the metal piece having a phase difference β represented by the following equation (2):

$$\beta = (c-d)/\lambda \times 2\pi \quad (2),$$

wherein c represents an effective propagation distance of a surface plasmon polariton wave in view of an effective refractive index from the first vertex to the third vertex, d represents an effective propagation distance of a surface plasmon polariton wave in view of an effective refractive index from the second vertex to the third vertex, and λ represents a wavelength of a surface plasmon polariton wave.

The phase difference α described above of the periodic surface unevenness may preferably satisfy an equation (3) shown below and the metal piece has a phase difference β satisfying an equation (4) shown below:

$$\alpha = (2m+1)\pi \quad (3),$$

$$\beta = (2n+1)\pi \quad (4),$$

wherein m and n are integers.

A near-field optical head according to the present invention comprises any one of the near-field light generating structures described above and an optical detection apparatus for detecting near-field light generated from the near-field light generating structure.

A recording and reproducing apparatus for effecting recording and reproduction with respect to a recording medium on a stage according to the present invention comprises the above-described near-field light generating structure.

According to the first aspect of the present invention, it is possible to realize a near-field exposure mask which permits generation of near-field light at a high efficiency and is capable of generating intense near-field light at a desired position, a near-field light generating method, a near-field exposure mask manufacturing method, a near-field exposure mask manufacturing method, a near-field exposure apparatus, a near-field exposure method, and a microdevice manufacturing method. Further, it is possible to suppress a lateral expanse of a near-field light generation area. Accordingly, it becomes possible to perform a high-resolution exposure in a short time.

According to the second aspect of the present invention, it is possible to realize a near-field light generating structure which can provide near-field light improved in intensity and is capable of suppressing an expanse of a near-field generation area in a lateral direction to a low level, a near-field optical head having the structure, a near-field recording and reproducing apparatus including the near-field optical head, and a surface observation apparatus including the near-field optical head.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

First, an embodiment according to the first aspect of the present invention will be described.

In the first aspect of the present invention, as described above, there is typically provided a near-field exposure mask, having a pattern of a fine metal structure, comprising a mask base material and a light blocking layer or a pattern of a fine opening provided in the light blocking layer, the fine metal structure or the fine opening having a size of not more than a wavelength of light for exposure, wherein at least one of a cross section of the fine metal structure in a direction perpendicular to the mask surface has an asymmetrical sectional shape with respect to an arbitrary axis perpendicular to the mask surface.

A near-field light generating method in this embodiment will be explained.

In this embodiment, in order to generate near-field light at a desired position and to enhance an intensity of the near-field light, three phenomena including <1> electrical field concentration, <2> interference of surface plasmon polariton (SPP) waves, and <3> plasma oscillation of free electrons in metal are principally used.

These are based on findings of the inventors such that it becomes possible to generate near-field light at a desired position, particularly, a position adjacent to a vertex on an outgoing surface side of a fine metal structure or a fine opening by causing the above-described phenomenon to occur in an asymmetrical system with respect to incident light.

Herein below, a principle of an increase in intensity of near-field light at a desired position adjacent to the surface of the fine metal structure due to occurrences of the above-described phenomena in the fine metal structure or the fine opening will be described.

First, the phenomena <1> to <3> described above will be explained.

The phenomenon <1> (electrical field concentration) is such a phenomenon that when a substance having a shape including a corner such as a vertex is placed in an electrical field, the electrical field is concentrated on the vertex. This phenomenon is well known in the field of electromagnetics and a detailed explanation thereof will be omitted. An effect of the electrical field is larger as the vertex is projected in the electrical field direction and is sharper. However, even when the vertex is projected in a direction perpendicular to the electrical field direction, it produces little effect of electrical field concentration.

Next, the phenomenon <2> (interference of SPP waves) will be described.

The SPP wave is a charge-density wave generated at an interface between a metal and a dielectric. The SPP wave cannot be coupled with ordinary propagation light, but can be coupled with an evanescent wave or propagation light generated by use of a scattering member.

Figure 1A:
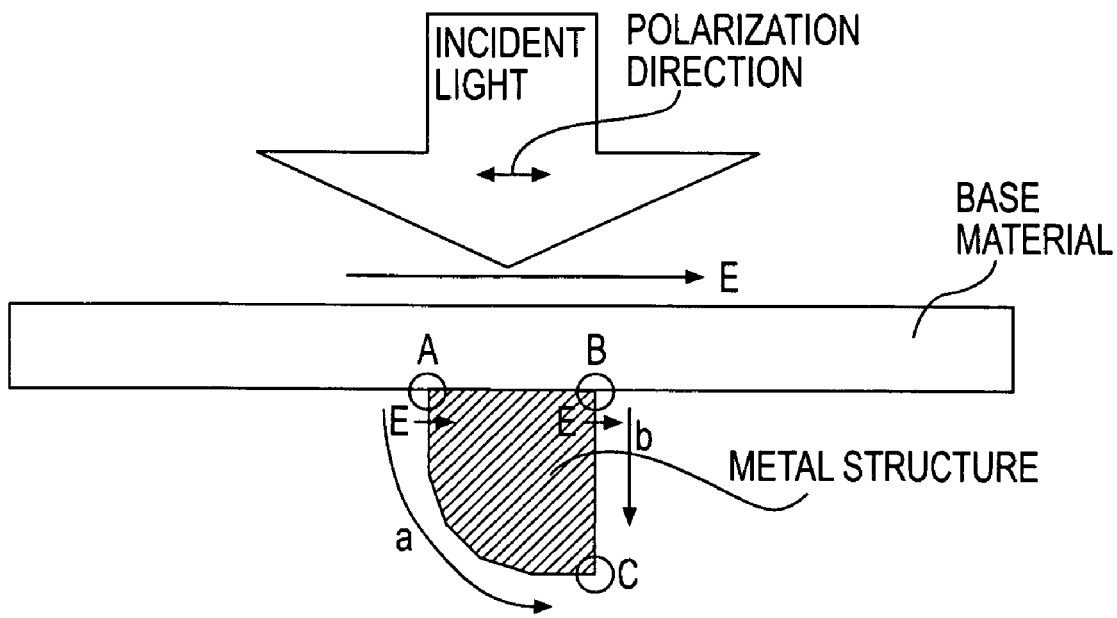
FIGS. 1(a) and 1(b) are schematic views illustrating an embodiment of the present invention.

FIG. 1(a) is an embodiment of the present invention. Referring to FIG. 1(a), a fine structure made of metal (fine metal structure) is formed on a surface of a base material. Light is incident on the fine metal structure. Polarized light of this light has a polarization direction corresponding to a direction of a vector of an optical electrical field E. The fine metal structure creates a metal-air interface with ambient air. When the light enters the interface, vertexes A and B function as scattering means, so that an SPP wave is generated at the surface of the fine metal structure.

A phase of the SPP wave will be explained.

In FIG. 1(a), a direction of an optical electrical field at a certain time is represented by E. The optical electrical field E exerted on the vertex A is directed inside of the fine metal structure, but that exerted on the vertex B is directed outside of the fine metal structure. Accordingly, the directions of optical electrical fields E applied to the vertexes A and B at the same time are opposite from each other with respect to the surface of the fine metal structure. In other words, electrical fields of opposite phases are applied to the vertexes A and B. As a result, under application of the electrical fields, an SPP wave generated from the vertex A and an SPP wave generated from the vertex B have phases opposite from each other.

Figure 2A:
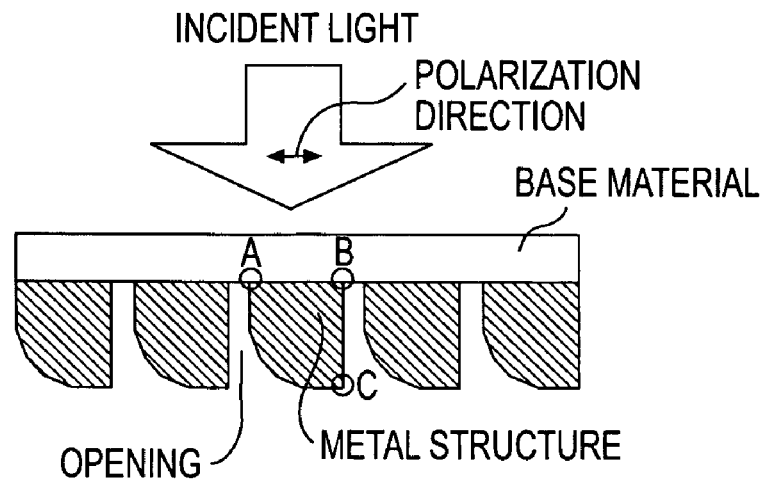
FIGS. 2(a), 2(b) and 2(c) are schematic views illustrating another embodiment of the present invention.

Next, propagation of these SPP waves to a vertex C is considered. The SPP wave propagated from the vertex A to the vertex C and the SPP wave propagated from the vertex B to the vertex C interfere with each other at the vertex C. In order to generate near-field light at the vertex C and its adjacent portion, the SPP waves are required to interfere with each other with the same plane. Accordingly, it is necessary to provide a difference, between a propagation distance a from the vertex A to the vertex C and a propagation distance b from the vertex B to the vertex C, being an odd multiple of a half-wavelength of an SPP wave. In other words, it is possible to generate strong near-field light in the neighborhood of the vertex C by preparing a fine metal structure having the above-described shape. Here, each of the distances a and b is not determined only by a geometrical shape of the fine metal structure, but refers to an effective propagation distance in vie of an effective refractive index, and so on, at the interface. For this reason, in the case wherein the fine metal structure is arranged in any array from (FIG. 2(a)) or in the case wherein another dielectric layer of a material having a high refractive index is formed at the surface of the fine metal structure, an effective refractive index at the interface is changed, so that it is necessary to determine the propagation distance while taking the change in refractive index into consideration.

Then, the phenomenon <3> (plasma oscillation of free electrons in metal) will be described.

When a metal structure is irradiated with light, free electrons located adjacent to the metal surface oscillate and follow oscillation of an optical electrical field. As a result, the optical electrical field is canceled at the surface of the metal or a portion immediately adjacent thereto, i.e., at a depth of about 10 nm, thus being prevented from entering the inside of the metal. However, when the metal structure has a thickness of not more than several tens of nanometers, the optical electrical field enters the metal structure, so that almost all the free electrons in the metal structure are affected by the optical electrical field to oscillate at a frequency substantially equal to that of the optical electrical field. When the fine metal structure and the incident light produce resonance, the whole free electrons cause plasma oscillation.

As a result, an electrical charge density distribution occurs in the fine metal structure to generate an electrical field in the neighborhood of the fine metal structure. This electrical field results in near-field light. The charge density distribution varies depending on a shape and permittivity of the fine metal structure, a frequency of light, etc. However, there is a tendency of the free electrons in the fine metal structure to receive a force in parallel with an incident optical electrical field vector, so that near-field light is generated in the neighborhood of a vertex, of vertexes of the fine metal structure, which is projected in an oscillation direction. For example, in the case of a fine metal structure shown in FIG. 1(b), intense near-field light is generated at vertexes A and C.

The phenomenon <2> (interference of SPP waves) and the phenomenon <3> (plasma oscillation of free electrons in metal) can occur at the same time. However, an effect of the interference of SPP waves (phenomenon <2>) is remarkable with respect to relatively large particles (having a diameter of about 100 nm to several microns), and an effect of the plasma oscillation (phenomenon <3>) is remarkable with respect to relatively small particles (having a diameter of several nanometers to several tens of nanometers). Further, an effect of the electrical field concentration (phenomenon <1>) is achieved irrespective of the size of the fine metal structure. For these reasons, it is desirable that further intense near-field light is generated on the basis of an additive effect of these phenomena.

Figure 1B:
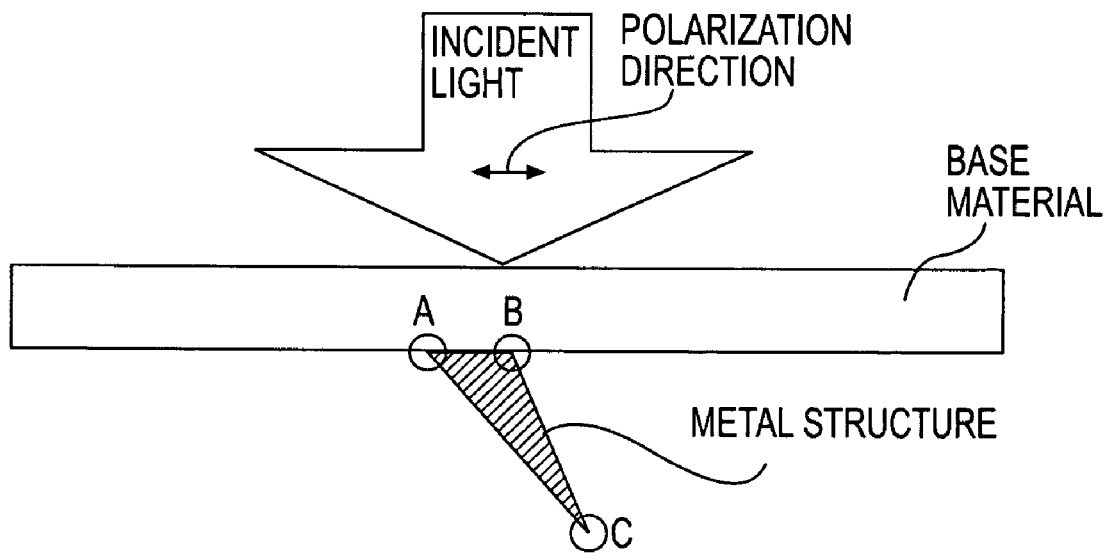

As described above, in this embodiment, the near-field light is generated by utilizing the above-described phenomena <1>, <2> and <3>. An asymmetry of a system is of primary importance to utilize the phenomena. For example, in the case wherein near-field light is generated in the neighborhood of the vertex C shown in FIG. 1(a), on the basis of the interference of SPP waves (phenomenon <2>), the propagation distances a and b of the SPP waves are required to provide a predetermined difference. Accordingly, it is necessary to ensure an asymmetry of the fine metal structure and its ambient environment with respect to incident light. Further, in the case of the plasma oscillation (phenomenon <3>), when the fine metal structure shown in FIG. 1(b) is symmetrical with respect to a direction of movement of incident light, near-field light is little generated in the neighborhood of the vertex C. In order to generate near-field light in the neighborhood of the vertex C, the fine metal structure is required to be asymmetrical even a little with respect to the incident direction of incident light. It is preferable that the vertex C shown in FIG. 1(b) is further projected to the right in the drawing.

Figure 2B:
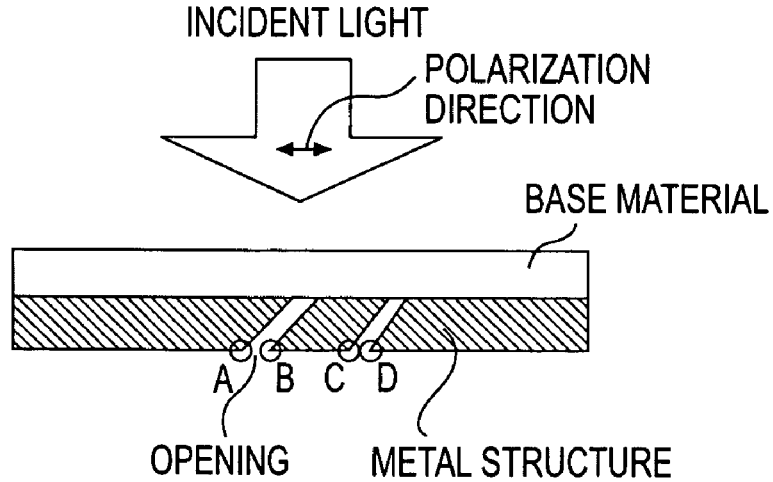
Figure 2C:
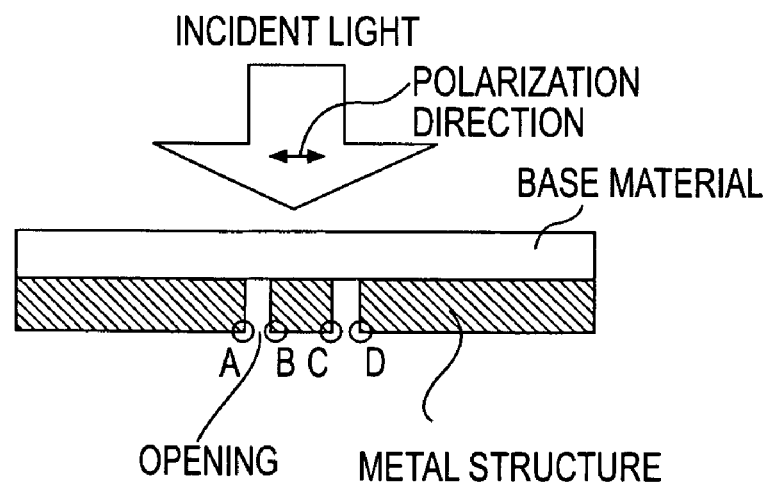

The above-mentioned phenomena <1> to <3> occur with respect to not only the fine metal structure, but also the fine opening. For example, in a system shown in FIG. 2(b), for the above-described reasons, it is possible to selectively generate near-field light in the neighborhoods of vertexes B and D. When the system is a symmetrical system shown in FIG. 2(c), the near-field light is generated equally in the neighborhoods of vertexes A to D. As a result, it is impossible to selectively generate the near-field light in this neighborhood of a desired vertex. Further, when the neighborhood of a sharp (acute) vertex cannot be selected as a position where the near-field light is generated, a light intensity of resultant near-field light is weakened. Accordingly, in order to generate intense near-field light at a desired position (particularly, in the neighborhood of an outgoing-side vertex of the fine metal structure or the fine opening), it is important to achieve the effects of the above-described phenomena <1> to <3> in an asymmetrical system.

An expanse of an area of generation of near-field light at a desired position in the above-described manner is very narrow in a direction parallel with the polarization direction of incident light, so that it is possible to form a latent image of a fine pattern at a desired position by utilizing such an expanse of the near-field light generation area to expose a photoresist to light.

Next, an embodiment according to the second aspect of the present invention will be described.

In the second aspect of the present invention, there is typically provided a near-field light generating structure, comprising:

a light blocking metal layer comprising a fine opening having a size of not more than a wavelength of polarization-controlled light incident from a light source and a metal piece disposed in the fine opening, wherein the metal piece has a sectional shape in a plane including a plane of polarization of the incident light, which is asymmetrical with respect to a center line of the fine opening.

In this embodiment, high-intensity near-field light can be generated by causing interference of SPP waves with the same phase in the neighborhoods of a vertex, of at least three vertexes of a metal piece disposed in a fine opening provided to a near-field light generating structure, being located on an optical electrical field-generating surface side opposite from a light-incidence surface side of the near-field light generating structure. This is based on findings of the inventors.

Figure 8:
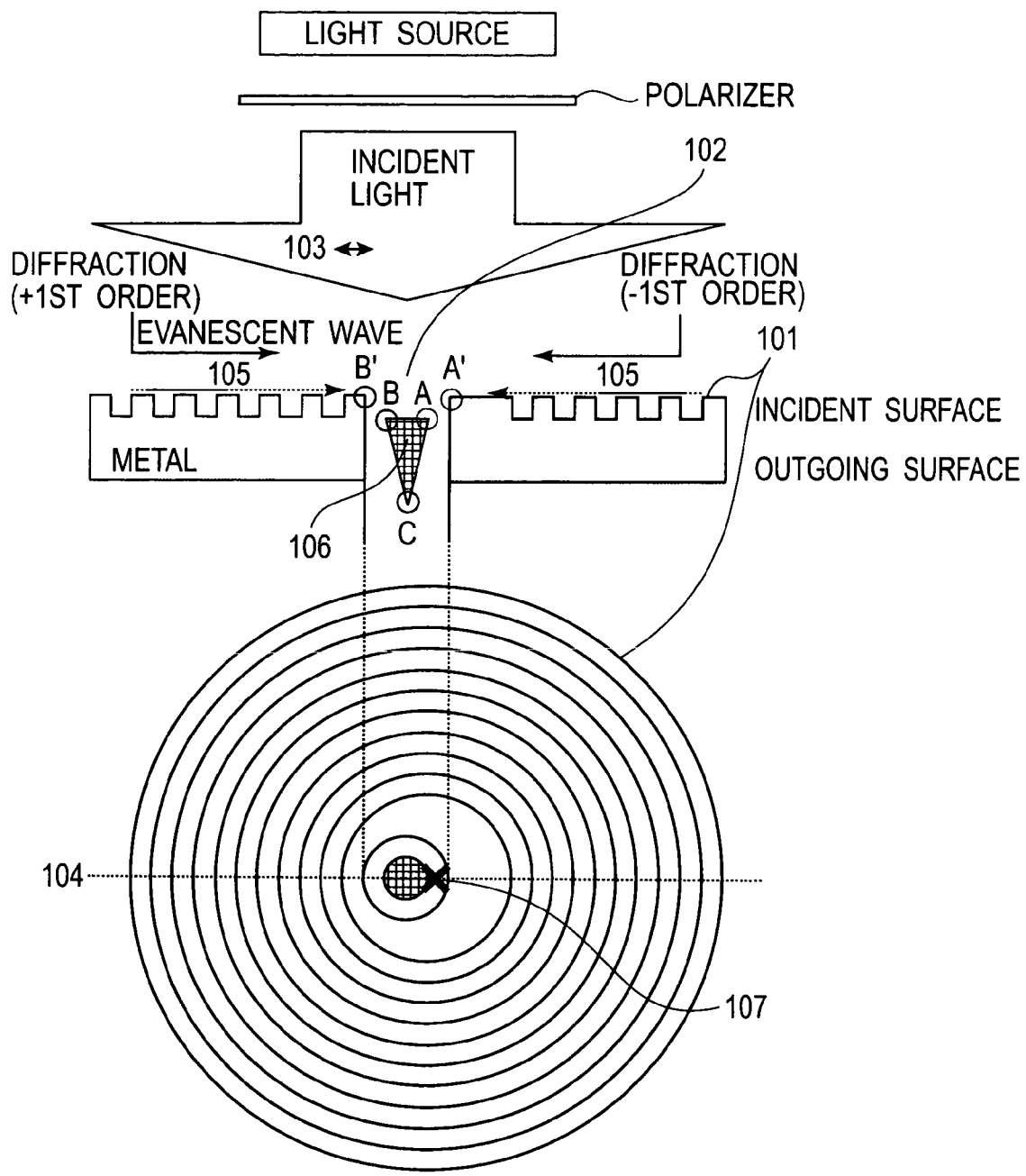
FIG. 8 is a schematic view illustrating an embodiment of the near-field light generating structure according to the present invention.
Figure 9A:
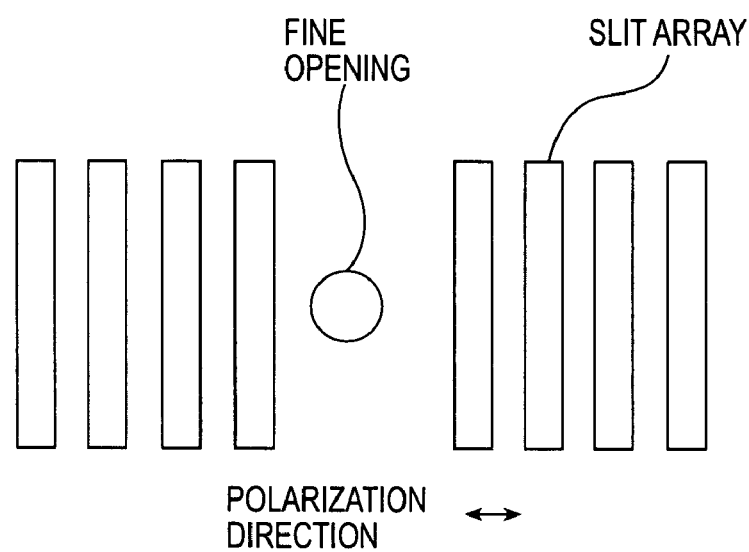
FIGS. 9(a) to 9(b) are schematic views each showing a two-dimensional shape of a grating usable in an embodiment of the present invention.
Figure 9B:
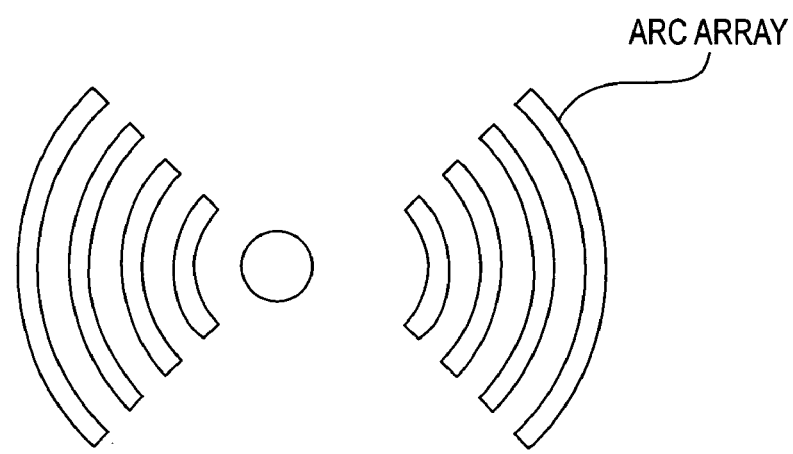

FIG. 8 shows a structure of the near-field light generating structure in this embodiment.

As shown in FIG. 8, a grating 101 is formed of a metallic member on a light blocking member provided with a fine opening 102, at its light-incidence surface. The grating 101 and the fine opening 102 are, e.g., disposed such that the fine opening 102 is surrounded by a concentric-circle grating pattern and shifted from a center 107 of the concentric-circle grating pattern, as shown in FIG. 8. A polarization direction 103 may preferably be substantially in parallel with an extended straight line 104 connecting the center 107 of the grating pattern with the center of the fine opening 102. The polarization direction corresponds to a direction of an optical electrical field vector.

A pitch of the grating (pattern) is set so that SPP waves 105 are excited at the grating surface. More specifically, a period of a periodic unevenness of the grating is set to be substantially equal to a wavelength of an SPP wave excited at the grating surface. In this embodiment, a two-dimensional shape of the grating is a concentric-circle shape, but may be other shapes, including those of a slit array and arcs of a circle, a parabola, an ellipse, etc., as shown in FIGS. 2(a)-2(c), 9(a) and 9(b).

Inside the fine opening 102, a metal piece 107 having three vertexes A, B and C is disposed. In this embodiment, intense near-field light is intended to be generated at a point corresponding to the vertex C. The position of the light-incidence side vertex C of the metal piece may desirably be such that it is substantially in the same plane as the light incidence surface of the light blocking member or projected from such a plane.

Next, a phase difference referred to herein will be defined specifically.

Figure 15:
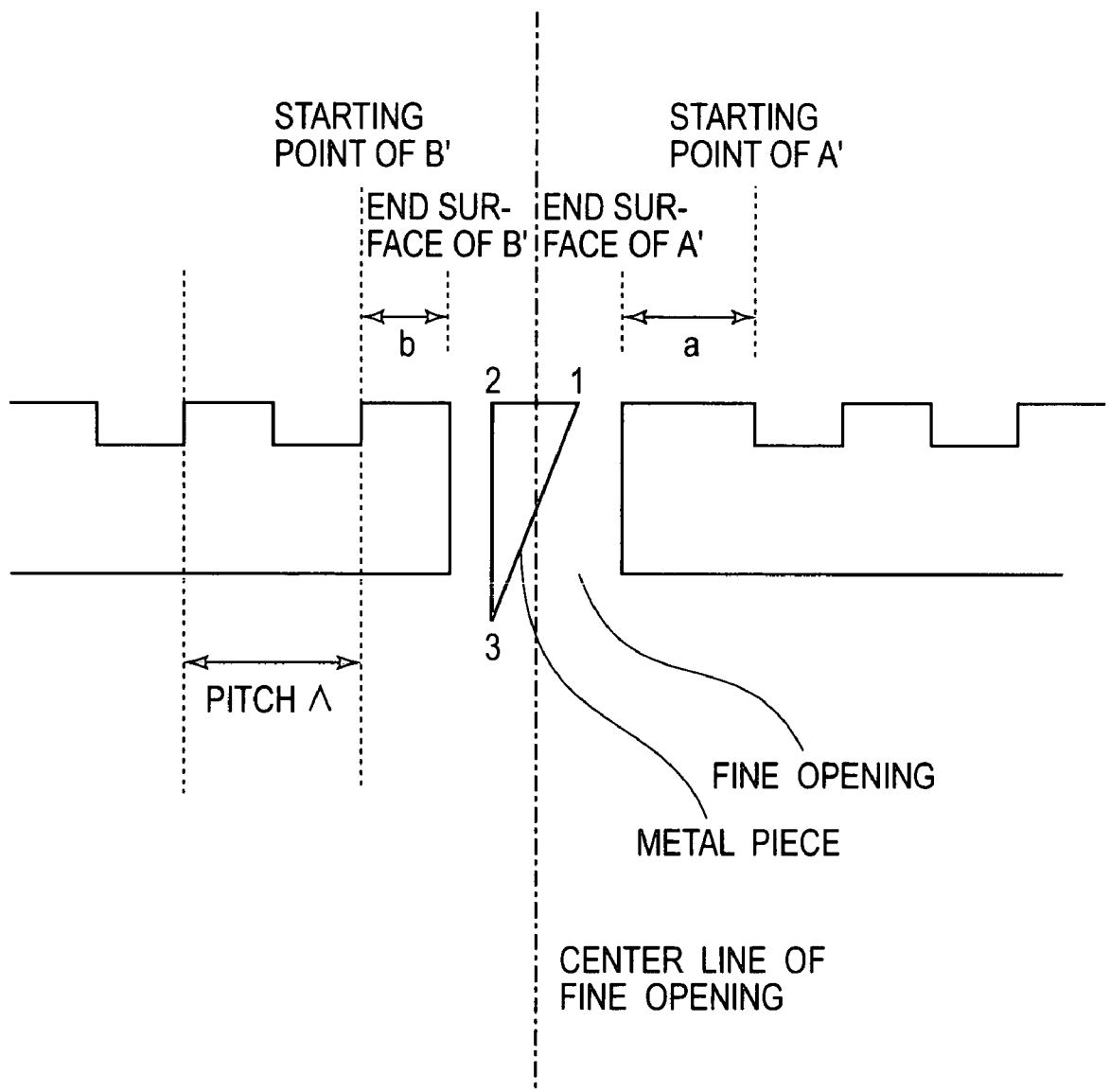
FIG. 15 is a schematic view illustrating a difference in phase between a grating and a method piece used in an embodiment of the present invention.

FIG. 15 is a sectional view of a periodic structure having a grating such that the periodic structure is cut along a plane which includes the fine opening center and is parallel with a plane of polarization of incident light.

Referring to FIG. 15, a (right-hand) periodic structure portion A' has an end surface and a starting point, which provides a distance a therebetween, and a (left-hand) periodic structure portion B' has an end surface and a starting point, which provide a distance b therebetween.

A periodic structure has a pitch Λ, which is substantially equal to a wavelength of the SPP wave.

A phase difference α of the periodic structure is defined as follows:

$$\alpha = (a-b)/\Lambda \times 2\pi,$$

wherein a represents a distance from the first vertex 1 to the third vertex 3, i.e., an effective propagation distance of an SPP wave therebetween in view of effective refractive index, etc.; b represents a distance from the second vertex 2 to the third vertex 3, i.e., an effective propagation distance of an SPP wave therebetween in view of an effective refractive index, etc., and Λ represents a wavelength of an SPP wave.

Referring again to FIG. 8, when light is incident on the light blocking member from a light-incidence side thereof, the light diffracts at about ninety degrees by the grating formed at the surface of the light blocking member to generate an evanescent wave, which excites an SPP wave along the grating surface.

With respect to the diffraction, a rightward diffraction is referred to as +1st order diffraction and a leftward diffraction is referred to as −1st order diffraction.

The excited SPP wave is concentrated toward the center 7 of a concentric-circle grating. When the vertexes A and B of the metal piece 106 are disposed adjacent to corners A' and B' located at end surfaces of the light blocking member, SPP waves propagated to the corners (end surfaces) A' and B' excite SPP waves through the vertexes A and B, respectively.

Here, phases of the SPP waves reaching the corners A' and B' are considered.

Figure 16:
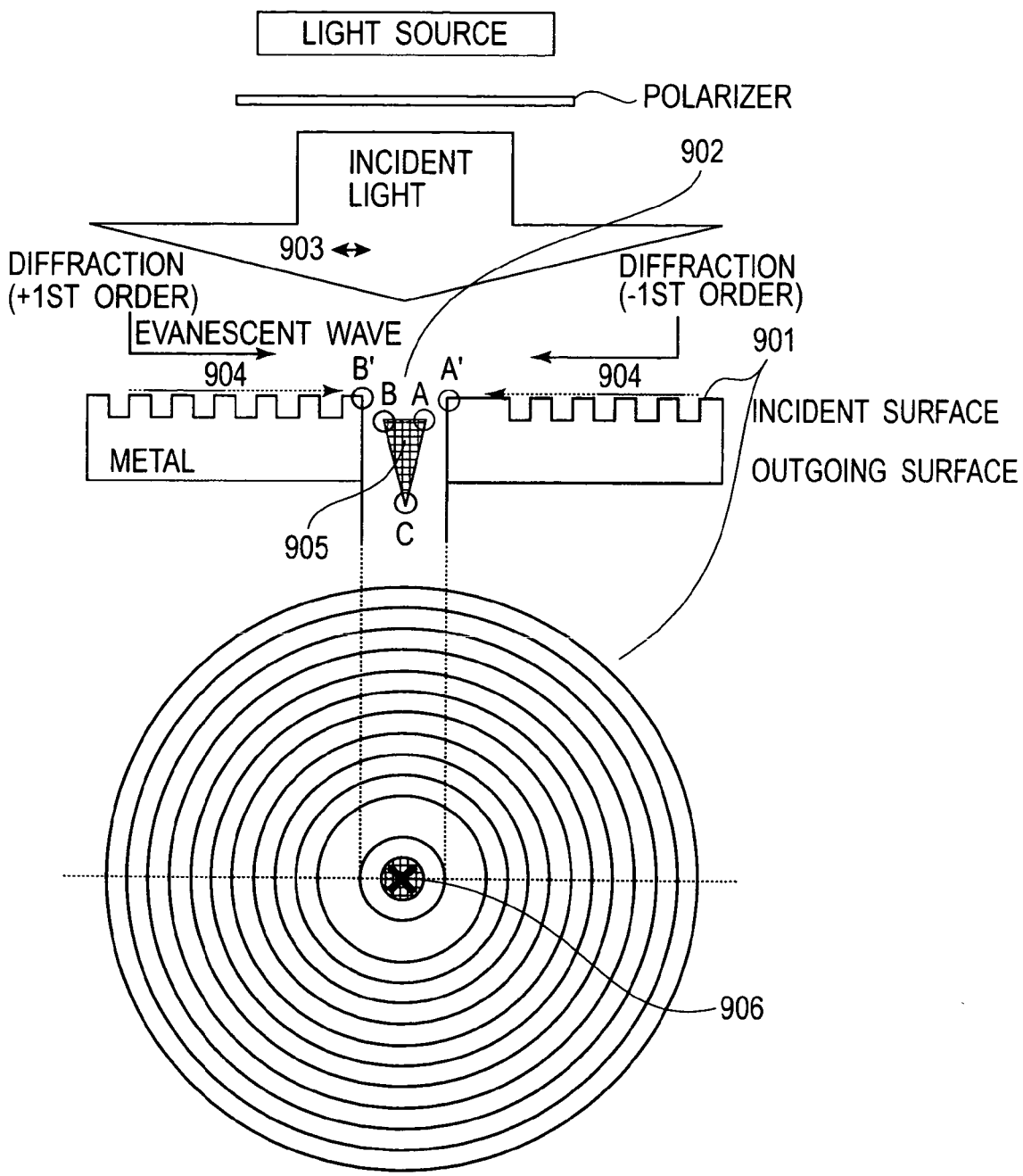
FIG. 16 is a schematic view illustrating an embodiment of the present invention.

Assuming that, as shown in FIG. 16, a grating 901 has a concentric-circle shape as a two-dimensional shape and concentric-circle center 906 corresponding to a center of a fine opening 901 in which a metal piece 905 having three vertexes A, B and C is disposed so that it has a symmetrical shape with respect to a center line of the fine opening 902 in such a plane which is parallel with a plane of polarization of incident light and includes the center 906 of a concentric-circle grating, phases of SPP waves 904 reaching the corners A' and B' at the same time, respectively, are diametrically opposite from each other when a polarization direction 903 is as shown in FIG. 16, since the grating 901 also has a symmetrical shape with respect to the fine opening 902.

This is because the SPP wave reaching the corner A' is excited by the −1st order diffraction light and the SPP wave reaching the corner B' is excited by the +1st order diffraction light. The +1st order diffraction light has a diffraction direction opposite from that of the −1st order diffraction light, so that directions of resultant electrical field vectors after the diffractions are also opposite from each other. The opposite vector directions are equivalent to opposite phases. As a result, SPP waves excited from the respective diffraction lights are also opposite in phase from each other.

Further, as described above, the cross-sectional shape of the metal piece 905 in the plane including the plane of polarization of incident light is symmetrical with respect to the center line of the fine opening 902 along the light-incidence direction, so that the propagation distance from the vertex A to the vertex C of the metal piece 905 is equal to that from the vertex B to the vertex C. As a result, at the vertex C, the SPP waves excited at the vertexes A and B, respectively, interfere with each other. For this reason, the electrical field strength becomes zero at the vector C, so that no, or not-too-intense, near-field light is generated. In this case, the above-described propagation distance is not a simple diametrical distance, but an effective propagation distance determined in view of an effective refractive index, etc.

As described above, it has been found that, in order to generate an intense near-field light at the vertex C, the SPP waves are required to interfere with each other. Accordingly, as shown in FIG. 8, the position of the fine opening 102 is shifted from the center 107 of the concentric-circle grating 101 in a direction including the plane of polarization, whereby the phases of the SPP waves reaching the corners A' and B' are controlled so that they are not opposite from each other. Particularly, for example, in the case wherein a position or shape of the grating or positions of the fine opening and the metal piece in the fine opening are set so that the SPP waves reaching the corners A' and B' have the same phase, the metal piece has a symmetrical cross-sectional shape with respect to the center line of a fine opening in the light-incidence direction, as described above. As a result, the SPP waves reach the vertex C of the metal piece with the same phase, so that a high-intensity near-field light is generated at the vertex C surface and the neighborhood thereof under a strong electrical field.

Further, the strength or distribution of the electrical field generated at the vector C varies depending on, e.g., a radius of curvature at the vertex C. In the case wherein there is no member in the fine opening, near-field light is generated through the fine opening and a size of a generation area of a near-field light electrical field corresponds to a size of the fine opening. On the other hand, in the case wherein the metal piece having a sharp vertex is present in the fine opening, a size of the near-field light generation area is very small, so that it becomes possible to generate a further intense near-field light.

As described above, in order to generate the strong electrical field at the vertex C, the SPP waves are required to interfere with each other with the same phase at the vertex C.

More specifically, as described above, when the phase difference α is defined as: $\alpha = (a-b)/\Lambda \times 2\pi$, the phase difference α is set to satisfy the following equation: $\alpha = (2m+1)\pi$ (m: integer).

Figure 10:
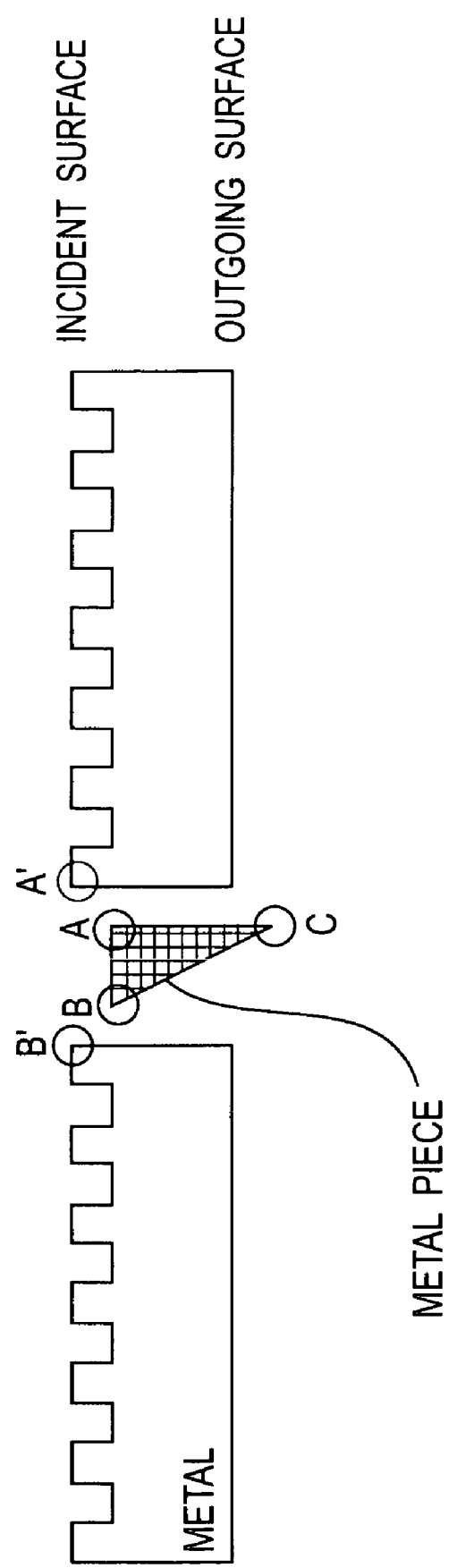
FIG. 10 is a schematic view showing such a structure that a cross-sectional shape of a metal piece in a plane including a plane of polarization of incident light is asymmetrical with respect to a moving direction of the incident light.

In order to cause interference between the SPP waves at the vertex C with substantially the same phase, it is possible to use a method other than the above-described method utilizing asymmetry of the grating shape and the fine opening position. For example, even in the case wherein the fine opening is located at the center of the concentric-circle grating, as shown in FIG. 10, the cross-sectional shape of the metal piece, including the plane of polarization of incident light, in the fine opening may be changed to be asymmetrical with respect to a line in the moving direction of incident light. Alternatively, the cross-sectional shape of the metal piece may be simply changed to be asymmetrical without using the above-described grating.

In these cases, SPP waves reach the corners A' and B' with dramatically opposite phases. Accordingly, at the vertexes A and B, SPP waves are excited with opposite phases. However, as shown in FIG. 10, the sectional shape of the metal piece is asymmetrical, so that the propagation distance, of the SPP wave excited at the vertex A, from the vertex A to the vertex C is different from that, of the SPP wave excited at the vertex B, from the vertex B to the vertex C, thus permitting interference between the SPP waves at the vertex C with substantially the same phase. As a result, it becomes possible to generate a high-intensity near-field light in the neighborhood of the vertex C under the strong electrical field.

More specifically, as described above, the phase difference β as defined by the equation: $\beta=(c-d)/\Lambda \times 2\pi$ may be set to satisfy the following equation: $\beta=(2n+1)/\pi$ (n: integer).

Alternatively, by using both the phase difference β of a periodic structure of the grating and the phase difference β of the metal piece, the sum of the phase differences α and β (i.e., α+β) may be set to satisfy the following equation: $\alpha+\beta=(2k+1)\pi$ (k: integer).

As a method of generating the near-field light in the neighborhood of the vertex C, it is also possible to use a method wherein a strong electrical field is generated at a vertex portion of the metal piece by creating bulk plasma oscillation in the metal piece, in addition to the above-described method wherein the SPP waves are generated at the surface of the metal piece and caused to interfere with each other thereat. Herein, the bulk plasma oscillation refers to such a stage that almost all the free electrons in the metal piece oscillate in the same direction at substantially the same frequency.

With respect to the bulk plasma oscillation, it is necessary to consider that the oscillation frequency is determined depending on a permittivity or shape of the metal piece.

Figure 17:
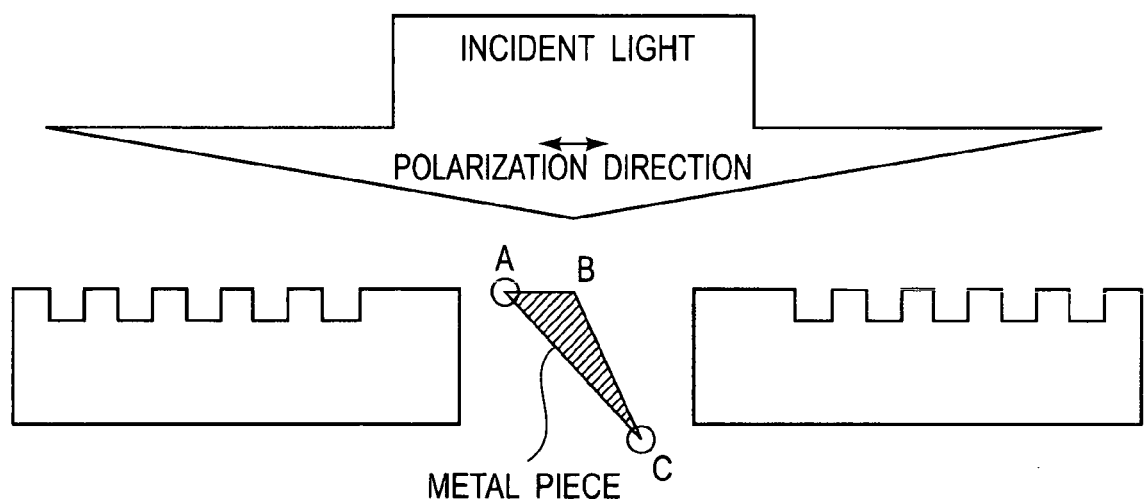
FIG. 17 is a schematic view illustrating such a state that near-field light is generated at a vertex of a metal piece used in an embodiment of the present invention.

When the bulk plasma oscillation occurs in the metal piece having vertexes, a strong electrical field is liable to be generated at vertex positions based on shapes thereof by the effect of electrical field concentration. By this phenomenon, e.g., in a system shown in FIG. 17, near-field light is generated generally at the vertexes A and C.

Further, the above-described phenomena can occur simultaneously. However, the effect of SPP wave propagation is remarkable when the metal piece has a size (diameter) of about 100 nm to several microns, and the plasma oscillation is noticeable when the metal piece has a size of about several nm to several tens of mm.

Herein below, specific embodiments of the present invention will be described.

Embodiment 1

FIGS. 3(a) to 3(f) are sectional views illustrating production steps of a near-field exposure mask manufacturing method in this embodiment.

First of all, a substrate S301 of a Si wafer with a (100) plane is prepared. On each of both surfaces of the substrate 301, a 500 nm-thick silicon nitride layer is formed as a base material 302 (FIG. 3(a)).

Next, a back-etching opening 303 is formed as a pattern on the light-incident surface of the base material 302 through lithography. On the light-outgoing side surface of the base material 302, a 50 nm-thick light blocking metal layer 304 of Cr is formed (FIG. 3(b)).

Then, on the light blocking metal layer 304, an etching mask layer (not shown) is formed and patterned into a slit array shape by using an electron beam (EB) drawing apparatus and a dry etching apparatus. Thereafter, a fine pattern 305 is formed in the light blocking metal layer 304 and the etching mask layer is removed (FIG. 3(c)). The patterning may also be performed through other methods including a lift-off method. These methods may be used singly or in combination, so as to provide a desired pattern. A material for the etching mask layer is not particularly limited, but may preferably be $SiO_2$, SiN, a photoresist material, etc. The fine pattern 305 is formed so as to leave a width, of the light blocking metal layer 304, of about 110 nm.

Figure 3A:
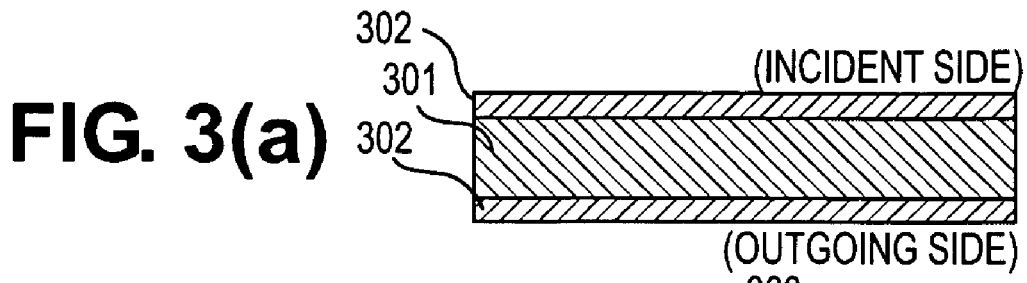
FIGS. 3(a) to 3(f) are schematic views illustrating an embodiment of the near-field exposure mask manufacturing method according to the present invention.
Figure 3B:
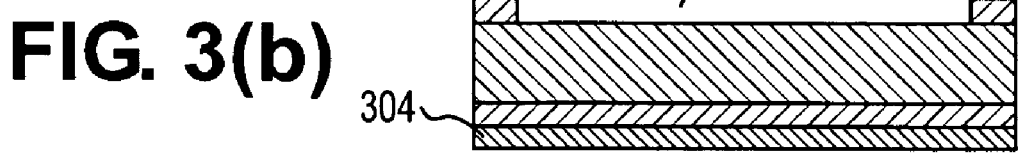
Figure 3C:
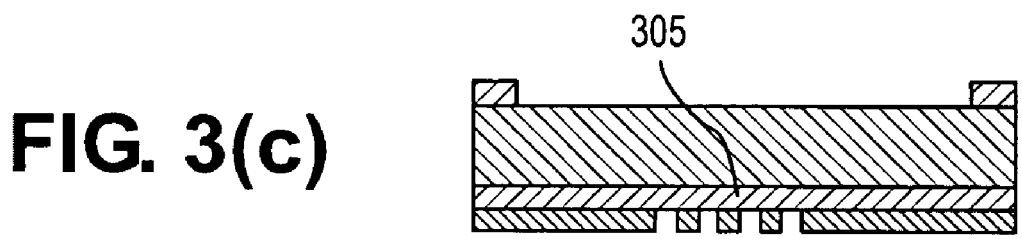
Figure 3D:
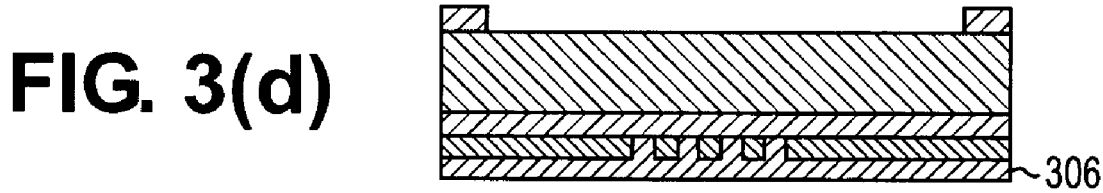
Figure 3E:
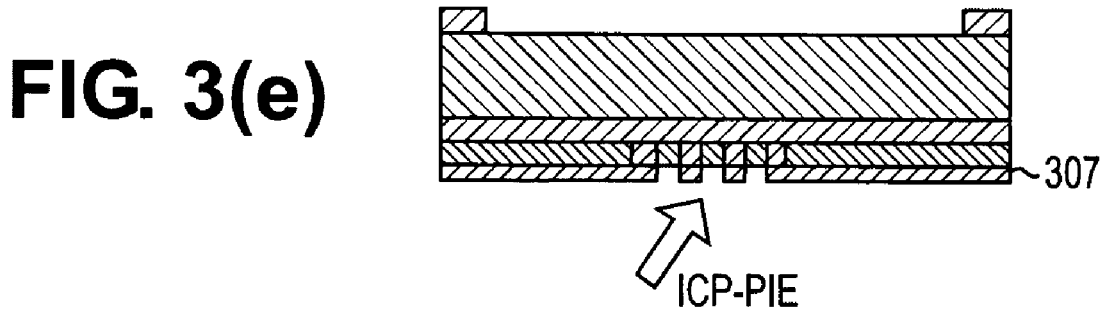
Figure 3F:
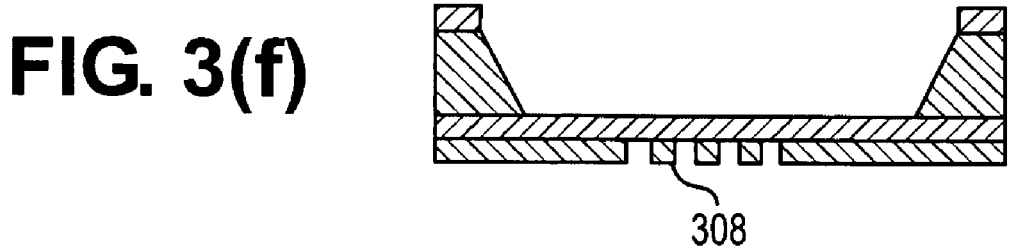

Next, an auxiliary layer 305 of $SiO_2$ is formed on the light blocking metal layer 304 and the fine pattern 305 by sputtering (FIG. 3(d)).

After the surface of the auxiliary layer 306 is polished so that it is flush with the surface of the light blocking metal layer 304, a 20 nm-thick metal layer 307 of Al is formed and subjected to patterning, so as to cover the opening of the fine pattern 305. Thereafter, oblique etching with an inductively coupled plasma-reaction ion etching (ICP-RIE) apparatus is performed (FIG. 3(e)). However, this processing may be performed by using another method.

Then, the metal layer 307 is removed and the auxiliary layer 306 is also removed. Thereafter, a 50 nm-thick high-refractive index layer 308 of silicon nitride is formed and subjected to patterning with the above-described EB apparatus, etc., whereby the silicon nitride layer is formed on the fine pattern 305. Then, in a KOH aqueous solution, anisotropic etching of the resultant structure is performed to prepare a mask with a membrane structure of the base material and the light blocking metal layer (FIG. 3(f)).

In this embodiment, the mask provided with the membrane structure is prepared. However, when the substrate 301 is formed with a transparent substance, the membrane structure is not necessarily needed.

Light from a mercury lamp (wavelength: 436 nm) is caused to be incident on the above-prepared near-field light generating mask, so that an SPP wave (wavelength: about 400 nm) is generated at the surface of a light blocking metal layer.

Based on the structure of the mask, a difference between a propagation distance of an SPP wave from the first vertex to the third (light outgoing-side) vertex and a propagation distance of an SPP wave from the second vertex to the third vertex is 100 nm. In view of an effective refractive index, the difference in propagation distance becomes 200 nm, which is about one-half the wavelength of an SPP wave. Accordingly, near-field light is generated in the neighborhood of the third vertex.

By using the near-field exposure mask according to this embodiment, it is possible to effectively convert incident light energy into near-field light. Further, based on the shape of the light blocking metal layer, it becomes possible to narrow an area in which intense near-field light is generated. Further, by the presence of the high-refractive index layer, it becomes possible to easily provide a desired difference in propagation distance of an SPP wave at the surface of the light blocking metal layer.

In this embodiment, the cross-sectional shape of the light blocking metal layer is substantially a triangle. The triangle shape can be relatively simply provided, so that it is a preferable shape. Further, when one of the vertexes on the light incident side is provided with an obtuse angle, an intensity of the resultant near-field light is preferably increased. However, in the present invention, the sectional shape of the light blocking metal layer is not restricted to the above-described shapes, but may be, e.g., a parallelogram provided in the step shown in FIG. 3(e) described above.

In the case of the parallelogram, the resultant mask has a relatively planar surface on its light-outgoing side, thus retaining its surface strength. Further, the sectional shape of the light blocking metal layer may be an asymmetrical polygon or such a shape having a rounded corner. When these shapes are employed, as the number of vertexes of the polygon becomes larger, propagation loss of an SPP wave per one vertex is decreased. As a result, it becomes possible to efficiently propagate an SPP wave to the vertex on the light-outgoing side.

Further, when the phase difference of an SPP wave can be adjusted to a desired value only by the sectional shape of the light blocking metal layer without using the high-refractive index layer, it is possible to manufacture the near-field exposure mask according to the present invention through simpler steps.

In this embodiment, the fine metal structure is formed, but it is also possible to form a fine opening in a desired shape by use of a similar method.

Embodiment 2

Figure 4A:
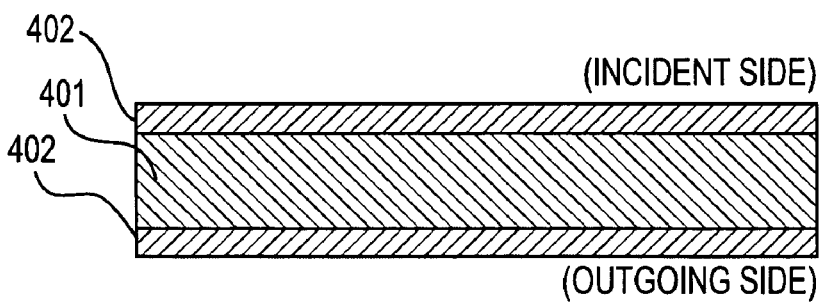
FIGS. 4(a), 4(b) and 4(c) are schematic views illustrating another embodiment of the near-field exposure mask manufacturing method of the present invention.
Figure 4B:
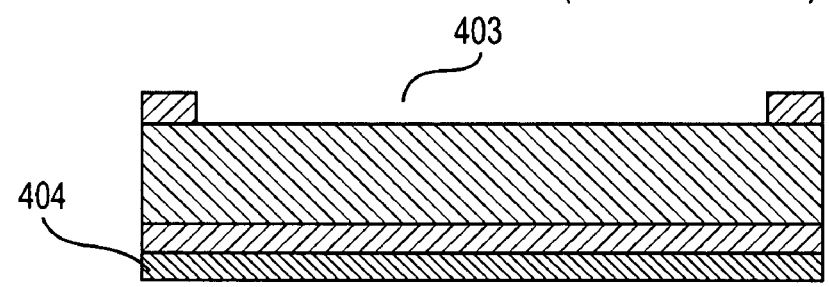
Figure 4C:
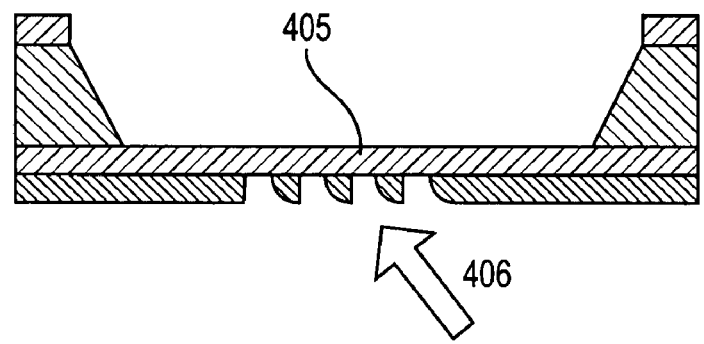

FIGS. 4(a) to 4(c) are sectional views for illustrating production steps of a near-field exposure mask manufacturing method in this embodiment.

First, a substrate 401 of a Si wafer with a (100) plane is prepared. On each of both surfaces of the substrate 401, a 500 nm-thick silicon nitride layer is formed as a base material 402 (FIG. 4(a)).

Next, a back-etching opening 403 is formed in a pattern on the light-incident side surface of the base material 402 through lithography. On the light-outgoing side surface of the base material 402, a 50 nm-thick light blocking metal layer 404 of Cr is formed (FIG. 4(b)).

Then, the light blocking metal layer 404 is subjected to a patterning with a focused ion beam 406. At that time, the light blocking metal layer 404 is formed in an asymmetrical shape by obliquely irradiating the substrate with the focused ion beam 406. Thereafter, in a KOH aqueous solution, anisotropic etching of the resultant structure is performed to prepare a near-field exposure mask with a membrane structure of the base material and the light blocking metal layer (FIG. 4(c)). The mask has a grating pitch of about 100 nm.

Light from a mercury lamp (wavelength: 436 nm) is caused to be incident on the near-field exposure mask prepared above. In the light blocking metal layer, plasma oscillation is generated by free electrons of metal. As a result, near-field light is generated in the neighborhood of the light-outgoing side vertex of the light blocking metal layer. A generation area of the near-field light is limited to the light-outgoing side vertex ad and its immediate neighborhood.

By the near-field exposure mask of this embodiment, it is possible to efficiently convert incident light energy into near-field light. Further, based on the sectional shape of the light blocking metal layer, it is possible to decrease an area in which intense near-field light is generated.

In this embodiment, the sectional shape of the light blocking metal layer is such an asymmetrical rectangle having two vertexes with different radii of curvature on the light-outgoing side of the light blocking metal layer, but it is not restricted thereto. For example, the sectional shape may be a parallelogram or such a shape having a rounded corner. In that case, the size of the sectional shape of the light blocking metal layer may preferably be not more than about 100 nm for each side, similarly as in this embodiment.

Further, when the intensity distribution of the focused ion beam has an asymmetrical shape with respect to a moving direction of the focused ion beam, the irradiation direction of the focused ion beam may be one perpendicular to the light blocking metal layer, not one oblique to the light blocking metal layer as in this embodiment.

Further, in this embodiment, the light blocking metal layer is formed, but it is also possible to form a fine opening in a desired shape in a similar manner.

Embodiment 3

FIGS. 6(a) to 6(d) are sectional views illustrating production steps of a near-field exposure mask manufacturing method in this embodiment.

First, a substrate 601 of a Si wafer with a (100) plane is prepared. On each of both surfaces of the substrate 601, a 500 nm-thick silicon nitride layer is formed as a base material 602 (FIG. 6(a)).

Next, a back-etching opening 603 is formed in a pattern on the light-incident side surface of the base material 602 through lithography. On the light-outgoing side surface of the base material 602, a 50 nm-thick light blocking metal layer 604 of Cr is formed (FIG. 6(b)).

Figure 6A:
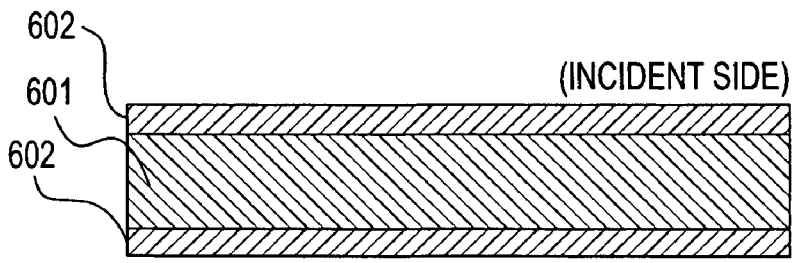
FIGS. 6(a) to 6(d) are schematic views illustrating another embodiment of the near-field exposure mask manufacturing method according to the present invention.
Figure 6B:
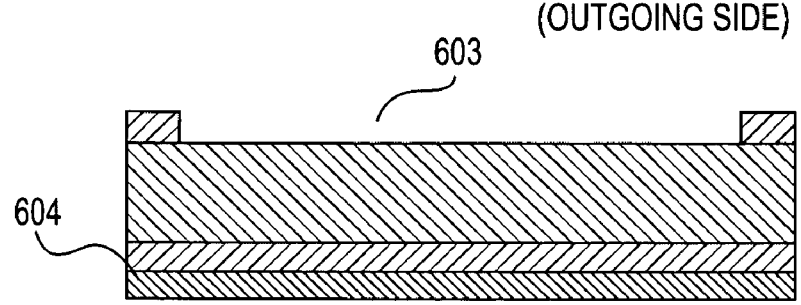
Figure 6C:
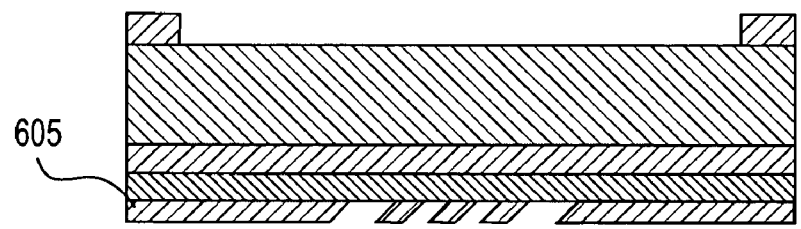
Figure 6D:
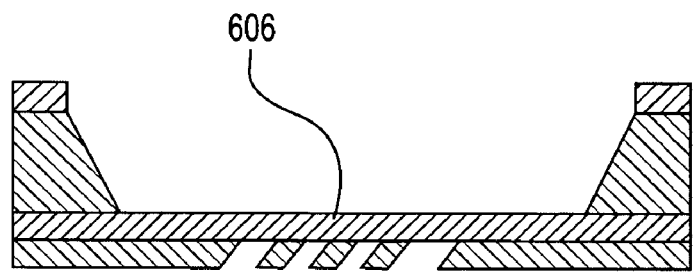

Onto the light blocking metal layer 604, a photoresist 605 is applied and subjected to patterning (FIG. 6(c)). During the patterning, the photoresist may preferably be exposed obliquely to light with respect to the substrate so as to provide an angle suitable for a subsequent step of performing oblique dry etching. Then, the dry etching is performed with respect to the substrate by using an ICP-RIE apparatus, etc. By effecting the oblique dry etching with respect to the substrate, the resultant structure is subjected to anisotropic etching in a KOH aqueous solution to provide a membrane structure of the base material and the light blocking metal layer provided with a fine pattern 606 having a parallelogram sectional shape.

Light from a mercury lamp (wavelength: 436 nm) is caused to be incident on a near-field exposure mask prepared above. In the light blocking metal layer, plasma oscillation is generated by free electrons of metal. As a result, near-field light is generated in the neighborhood of an acute-angle vertex of the light-outgoing side vertexes of the light blocking metal layer. A generation area of the near-field light is limited to the light-outgoing side acute-angle vertex ad and its immediate neighborhood.

By the near-field exposure mask of this embodiment, it is possible to efficiently convert incident light energy into near-field light. Further, based on the sectional shape of the light blocking metal layer, it is possible to decrease an area in which intense near-field light is generated.

In this embodiment, the sectional shape of the light blocking metal layer is a parallelogram, but it is not restricted thereto. For example, the sectional shape may be a polygonal shape having a rounded corner.

In this embodiment, the oblique dry etching is performed after obliquely exposing the etching mask layer to light with respect thereto, but the dry etching after the oblique exposure may be performed in a direction perpendicular to the light blocking metal layer. Even in the latter case, a film thickness distribution of the photoresist is created by the oblique exposure, so that it is possible to provide an asymmetrical light blocking metal layer even when the perpendicular dry etching is performed. The oblique exposure may be effected by using, e.g., multiple exposure or such an exposure method that an asymmetrical near-field distribution is created by obliquely exposing the near-field exposure mask to light and the etching mask layer is subjected to asymmetrical exposure and asymmetrical patterning by use of the asymmetrical near-field distribution.

Embodiment 4

Figure 5:
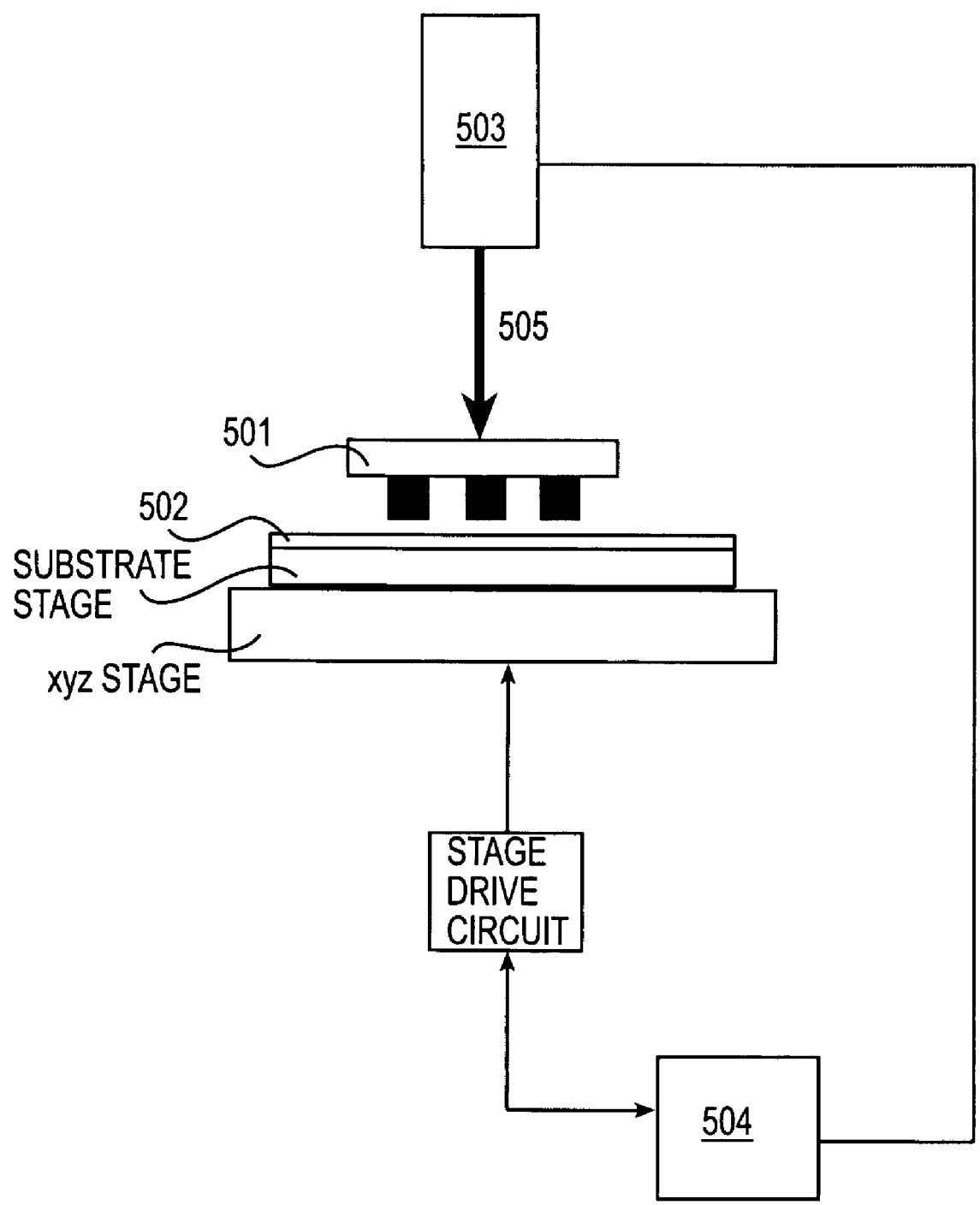
FIG. 5 is a schematic view illustrating an embodiment of an exposure apparatus to which the near-field exposure mask of the present invention is applied.

FIG. 5 shows a structure of an exposure apparatus to which the near-field exposure mask according to the present invention is applied, in this embodiment.

A resist 502 formed on a substrate 501 is irradiated with near-field light generated through a near-field exposure mask 501, thus being exposed to light to form a latent image.

A light source 502 generates light 505 having a wavelength for exposing the resist 502 to light.

By using a computer 504 for positional alignment and exposure control, positional alignment of the resist 502 with the near-field exposure mask 501 is effected.

According to this embodiment, in which the near-field exposure mask of the present invention is applied to the exposure apparatus, high-efficiency near-field light can be generated, so that it is possible to perform exposure in a short time. Further, the near-field generation area is very small, so that it becomes possible to effect high-resolution exposure.

Embodiment 5

Figure 7A:
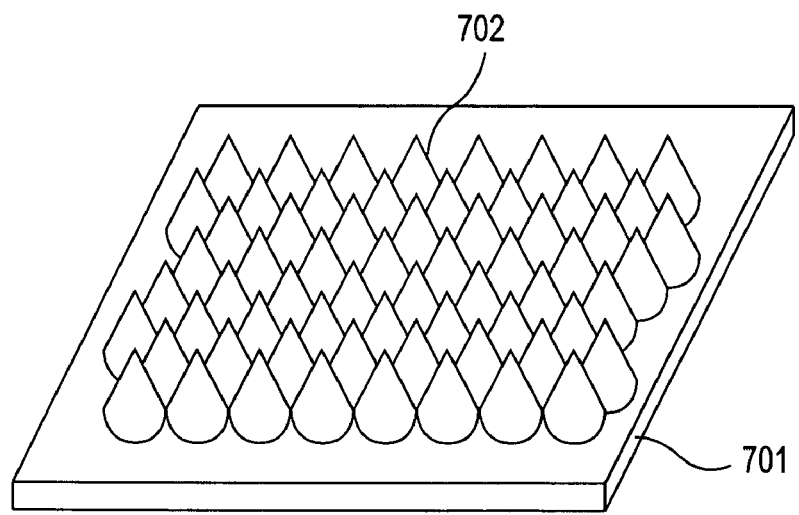
FIGS. 7(a) and 7(b) are schematic views illustrating an embodiment of the microdevice manufacturing method according to the present invention.
Figure 7B:
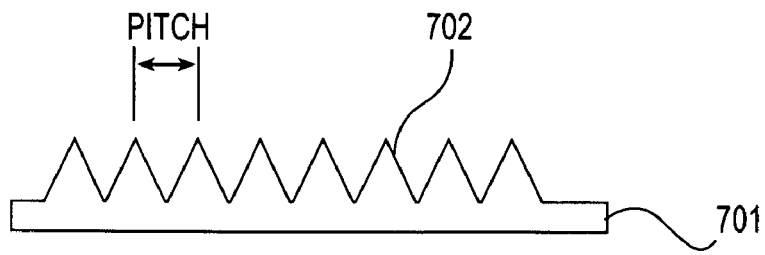

FIGS. 7(a) and 7(b) are views for illustrating a method of manufacturing a fine device in this embodiment.

In this embodiment, a reflection prevention structure device, as shown in FIGS. 7(a) and 7(b), is manufactured by use of a near-field exposure apparatus (or method) using the near-field exposure mask according to the present invention.

The near-field exposure apparatus (or method) using the near-field exposure mask of the present invention is suitable for the manufacture of an optical device having a sub-wavelength structure (SWS). With respect to the SWS, it is necessary to form a structure having a size of not more than 100 nm in a wide area, so that, e.g., the reflection prevention structure device shown in FIGS. 7(a) and 7(b) is used as the optical device having the SWS.

The reflection prevention structure device includes a quartz substrate 701 and a two-dimensional array of a conical structure 702 of quartz formed on the quartz substrate 601. When the quartz conical structure 702 has such a pitch that is smaller than a wavelength of light incident on the substrate 701, the conical structure 702 has a function of no reflection with respect to the incident light. Further, the conical structure 702 may have a partial reflection (scattering) function, similarly, as in Embodiment 1, by incorporating a partial defective portion in the conical structure, as desired.

The above-described reflection prevention structure device is manufactured by the following method.

First, the quartz substrate is successively subjected to application of a negative photoresist, exposure to light, and development, by use of the exposure apparatus described above, whereby the photoresist is formed in a pattern having a predetermined two-dimensional dot array shape.

Next, etching of the quartz substrate is performed by using the photoresist pattern having the two-dimensional dot array shape, whereby a conical structure, as shown in FIGS. 7(a) and 7(b), in which each of the cones has a pointed top and an expanded base, is formed.

According to the present invention, compared with a conventional device having a similar structure manufactured by a known self-organizing method, the reflection prevention structure device has a structure improved in regularity in period or size thereof, thus considerably improving device performances.

Embodiment 6

FIGS. 11(a) to 11(d) are sectional views for illustrating production steps of a manufacturing method of a structure for generating near-field light in this embodiment.

First, a substrate 401 of a Si wafer with a (100) plane is prepared. On each of both surfaces of the substrate 401, a 500 nm-thick silicon nitride layer is formed as a base material 402 (FIG. 4(a)).

Next, a back-etching opening 403 is formed in a pattern on the light-incident side surface of the base material 402 through photolithography. In the light-outgoing side of the base material 402, a periodic structure 404 is formed by resist patterning using electron beam drawing and photolithography (FIG. 4(b)). This treatment may be performed by use of a focused ion beam apparatus. The thus formed periodic structure has a concentric-circle structure.

Next, a back-etching opening 403 is formed in a pattern on the light-incident side surface of the base material 402 through photolithography. In the light-outgoing side of the base material 402, a periodic structure 404 is formed by resist patterning using electron beam drawing and photolithography (FIG. 4(b)). This treatment may be performed by use of a focused ion beam apparatus. The thus formed periodic structure has a concentric-circle structure.

Figure 11A:
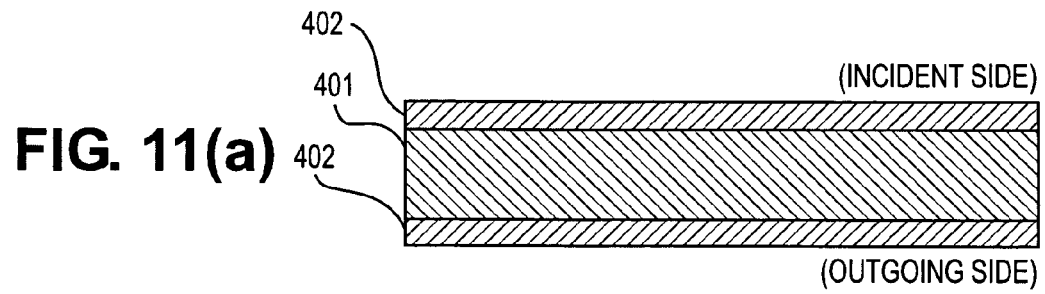
FIGS. 11(a) to 11(d) are schematic views illustrating a production step in an embodiment of the near-field generating structure according to the present invention.
Figure 11B:
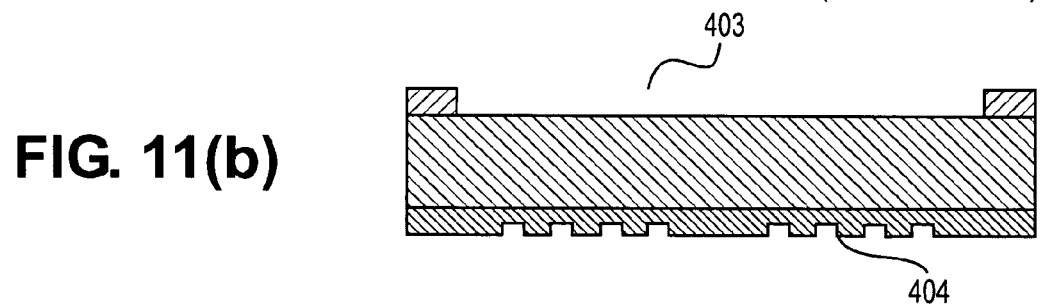
Figure 11C:
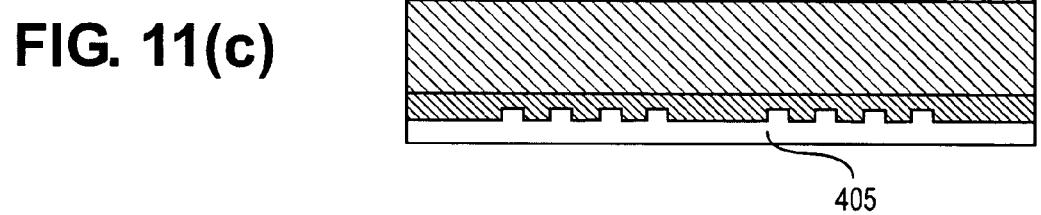
Figure 11D:
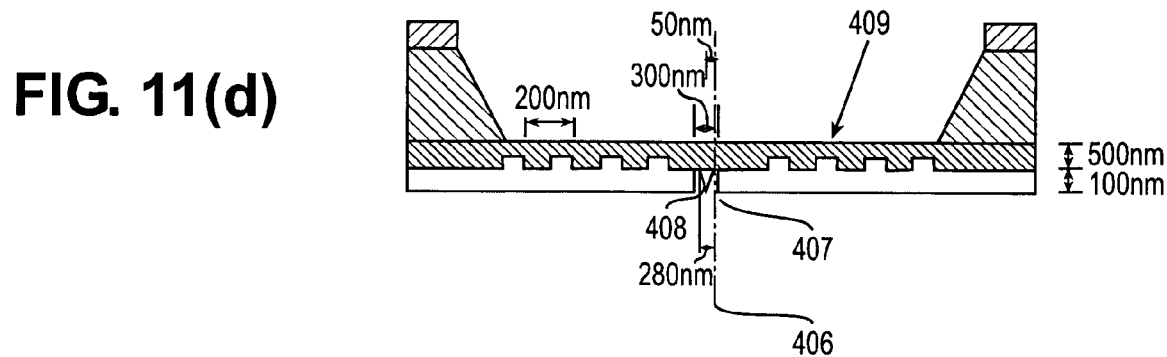

Next, on the periodic structure 404, a 100 nm-thick metal layer 405 of Cr is formed (FIG. 11(c)).

Thereafter, a fine opening 407 having a diameter of about 300 nm is provided in the metal layer 405 so that its center line is somewhat shifted from a center line 406 (indicated by alternating long and short dashed lines) of the above-prepared concentric-circle structure. At the center of the fine opening 407, a metal piece 408 having a diameter of about 280 nm is disposed. The shape of the metal piece 408 is determined in view of a wavelength (about 400 nm) of an SPP wave generated at an interface between air and Cr. The structure is subjected to anisotropic etching with a KOH aqueous solution to be provided with a membrane structure (FIG. 11(d)). These processings are performed through a focused ion beam processing. However, instead of this processing, it is also possible to effect etching after resist patterning by photolithography or electron beam drawing. The shape of the metal piece 408 is such that its sectional shape is symmetrical with respect to a center line of the metal piece in the movement direction of incident light in a plane which is in parallel with the plane of polarization and includes centers of the fine opening and the concentric-circle grating. As described above, a near-field light generating structure 409 is completed.

Figure 12:
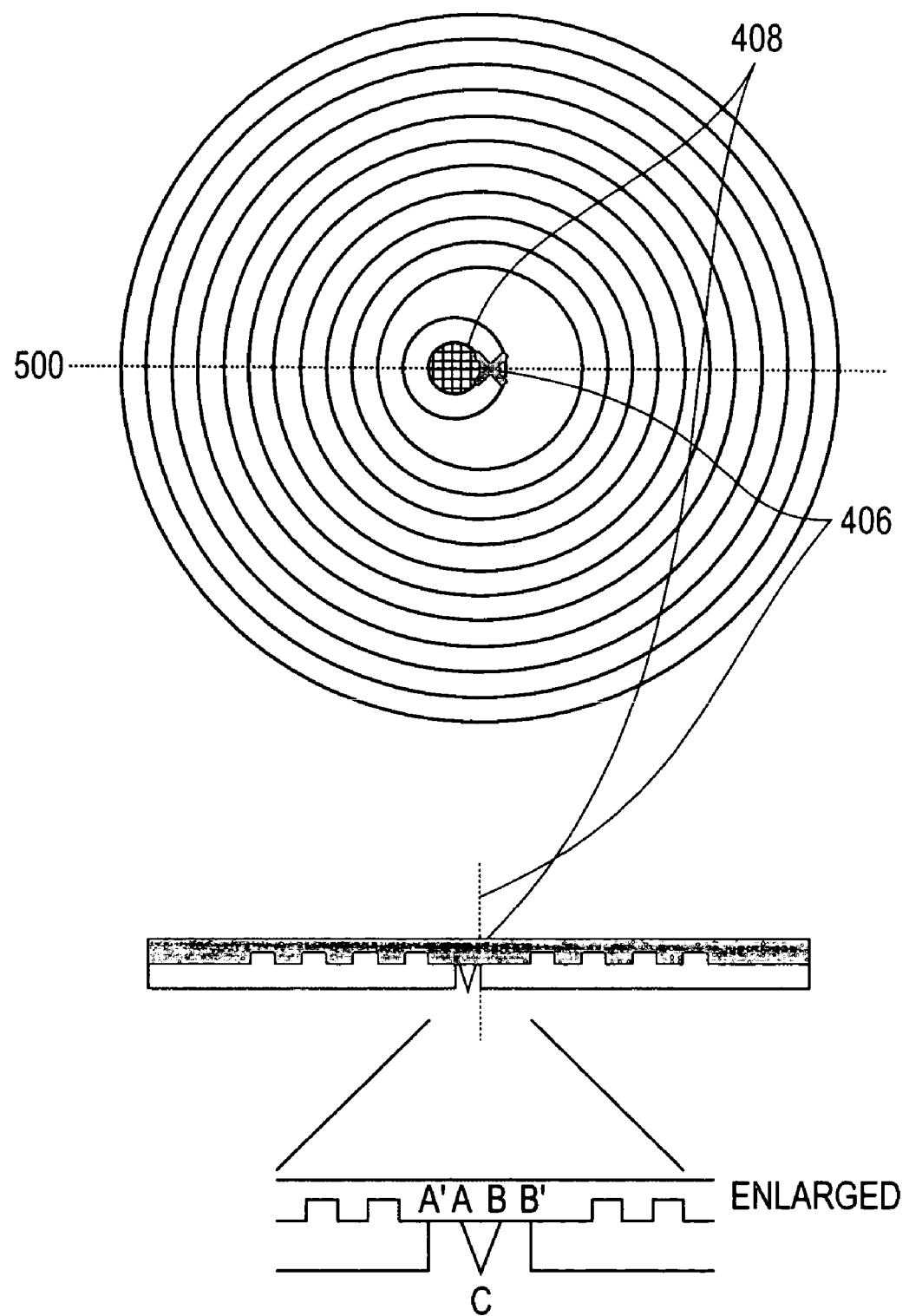
FIG. 12 is a schematic sectional view showing an embodiment of the near-field generating structure of the present invention.

FIG. 12 includes views on the basis of a line connecting the centers of the concentric-circle grating and the fine opening.

Light is caused to enter the above-prepared near-field light generating structure from its light-incident surface. The incident light is emitted from a mercury lamp (wavelength: 436 nm). The grating has a pitch of about 200 nm, since a SPP wave generated at an interface between silicon nitride and Cr has a wavelength of about 200 nm. Further, the position of a fine opening is shifted from the center of the concentric-circle generated by ¼ of the wavelength of the SPP wave (about 50 nm) so that SPP waves have the same phase at the time when they reach end portions A' and B' of the fine opening. The SPP waves propagated to the portions A' and B' pass through vertexes A and B to excite SPP waves at the surface of the metal piece. The excited SPP waves reach a vertex C to create a strong electrical field distribution at the vertex C and in the neighborhood thereof.

According to the near-field light generating structure in this embodiment, it is possible to efficiently convert the incident light energy into near-field light. Further, by the metal piece disposed in the fine opening, it is possible to decrease the area of generated strong electrical field.

In this embodiment, a two-dimensional shape of the grating is in the concentric-circle shape, but is not limited thereto. For example, the grating shape may be those of a slit, an arc, a parabola, a lattice, etc.

Further, in this embodiment, by shifting the position of the fine opening from the center of the grating pattern, the phase of SPP waves at the metal piece surface are controlled to generate the strong electrical field at the vertex C. However, the position of the fine opening may be the center of the grating pattern. In that case, in order to generate the strong electrical field at the vertex C, the section shape of a metal piece in the fine opening is made asymmetrical as shown in FIG. 10. It is also possible to use the asymmetrical grating pattern and the asymmetrical metal piece in combination.

Embodiment 7

Figure 13:
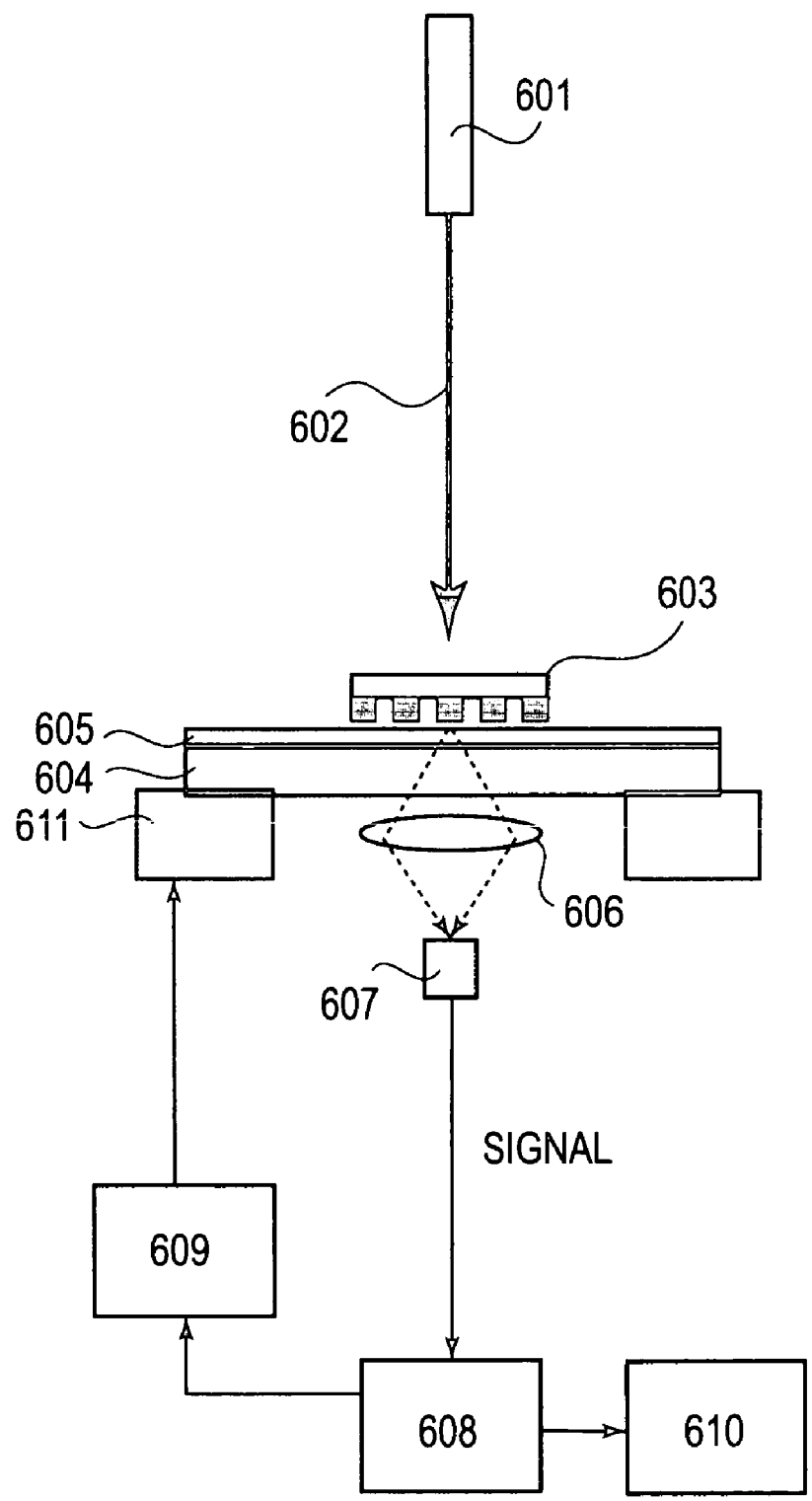
FIG. 13 is a schematic view showing a structure of an apparatus in which the near-field generating structure of the present invention is applied to an illumination-mode scanning near-field optical microscope (SNOM).

FIG. 13 shows a structure of an apparatus in which the near-field light generating structure of the present invention is applied to the SNOM.

Referring to FIG. 13, a near-field light generating structure 602 is irradiated with a light beam having a wavelength of 426 nm by use of a beam generating apparatus 601. The near-field light generating structure 603 comprises a concentric-circle like slit having a pitch of about 200 nm and has a periodic structure and other structural members similar to those used in Embodiment 1. The near-field light generating structure 603 is brought near to the surface of a sample 601 so that a distance therebetween is not more than 100 nm. The resultant scattered light is concentrated with a condensing lens 606 and detected by a photomultiplier 607 to provide an SNOM signal, which is inputted into a measurement control computer 608. The apparatus may also employ a near-field optical head shown in FIG. 7, wherein a beam generating apparatus 701, a near-field light generating structure 705, a condensing lens 707, and an avalanche photodiode 708, are used in combination.

From the measurement control computer 608, a drive signal for driving an xyz stage 611 is outputted through a stage drive circuit 609 to control a three-dimensional position of the xyz stage 611.

In the measuring control computer 608, a condenser portion for the sample 605 is scanned by driving the xyz stage 611 and an SNOM signal is three-dimensionally plotted depending on its position, whereby an SNOM image is formed on the sample surface to be displayed on a display 610.

By providing an illumination-mode SNOM apparatus with the near-field light generating structure of this embodiment, it is possible to achieve a resolution which exceeds a limitation of light diffraction. Further, it is possible to generate high-efficiency near-field light, so that a high-speed observation of the sample becomes possible.

By using the apparatus having the above-described structure in this embodiment, it is possible to provide a storage apparatus or an exposure apparatus.

Embodiment 8

Figure 14:
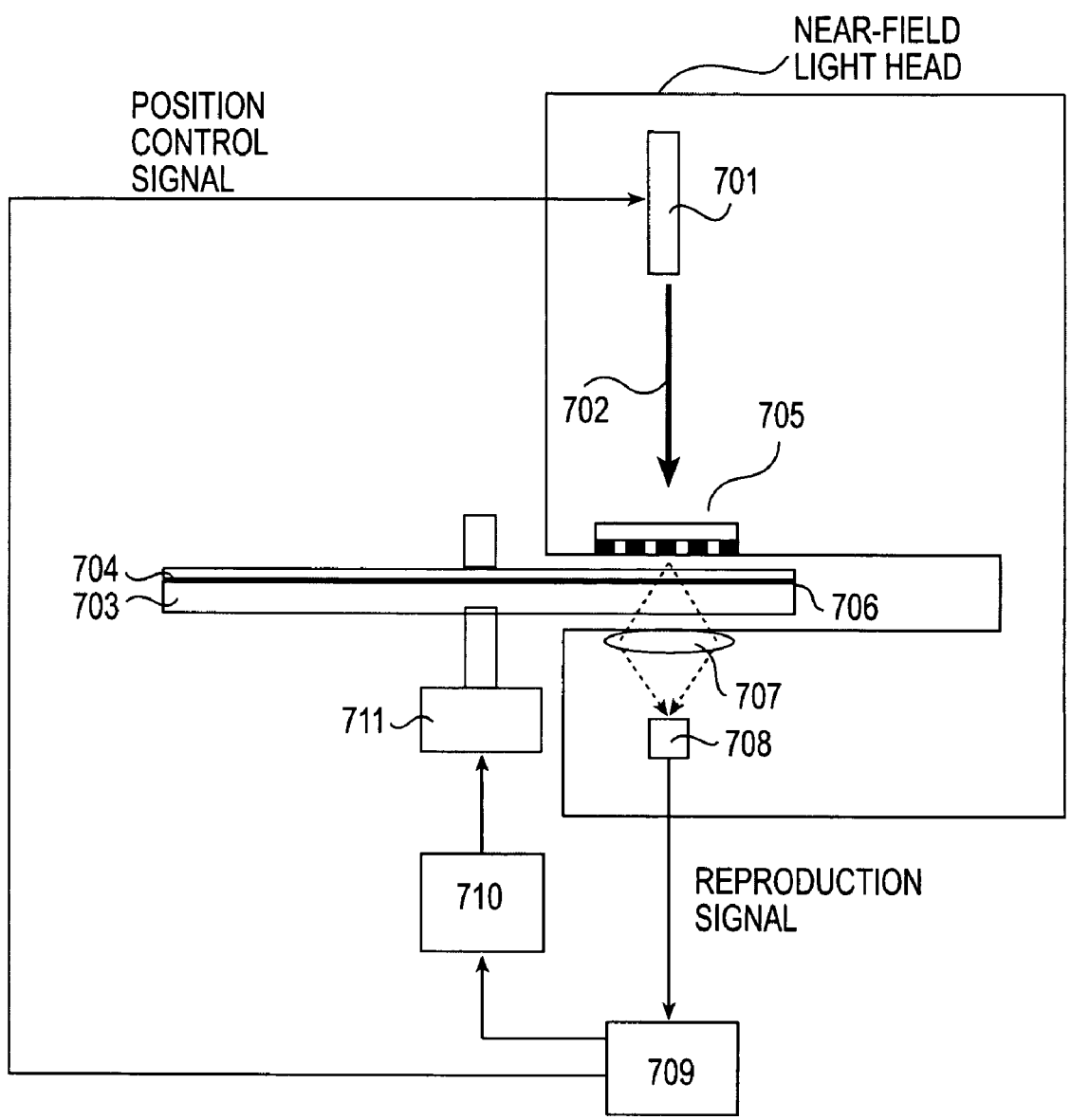
FIG. 14 is a schematic view showing a structure of an apparatus in which the near-field generating structure in an embodiment of the present invention is applied to a recording and reproducing apparatus.

FIG. 14 shows a structure of an apparatus in which the near-field light generating structure of the present invention is applied to a recording and reproducing apparatus.

Referring to FIG. 14, a near-field light generating structure 705 is irradiated with a light beam 702 having a wavelength of 436 nm emitted from a beam generating apparatus 701, and the near-field light generation structure 705 is brought near to a recording medium 704 disposed on a substrate 703 to effect recording and reproduction. The near-field light generating structure 705 has the same structure as that in Embodiment 6.

Recording is performed by using a high-intensity near-field light through an increasing in-beam intensity, and the recording medium 704 is irradiated with a low-intensity near-field light by decreasing the beam intensity. The resultant scattered light is connected by a condensing lens 707 and its intensity is detected by an avalanche photodiode 708 to provide a reproducing signal, which is inputted into a recording and reproducing control computer 709.

A rotation motor 711 is driven by a driving signal sent from the computer 709 through a rotation motor driving circuit 710, whereby the recording medium 704 is rotated with respect to the light beam. The resultant signal is inputted into the computer, as a position (tracking) signal, to be used for performing positional alignment of the recording medium 704 with respect to the beam generating apparatus 701.

By providing the recording and reproducing apparatus through a light-gathering method in this embodiment, it is possible to realize a recording density which exceeds a limitation of the light diffraction. This is because the near field is created in a small area in the neighborhood of a vertex of a metal piece in a fine opening. Further, high-efficiency near-field light is generated, so that recording and reproduction of information can be performed in a short time. Further, in order to improve a recording and reproducing speed, it is possible to provide a multi-head recording and reproducing apparatus with a plurality of probes, in this embodiment.

The near-field light generating structure of the present invention is used for constituting the recording and reproducing apparatus in this embodiment may also be used for constituting an information processing apparatus.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 321227/2003 filed Sep. 12, 2003, and No. 323252/2003 filed Sep. 16, 2003, which are hereby incorporated by reference herein.

What is claimed is:

1. A near-field exposure mask having a mask base material and a light blocking layer formed on the base material, the light blocking layer comprising a fine metal structure or fine opening formed in the light blocking layer,
   wherein the size of the metal structure or the size of the opening is not more than a wavelength of light for exposure, and at least one of a cross section of the fine metal structure in a direction perpendicular to a surface of the mask, and a cross section of the fine opening in a direction perpendicular to the mask surface has an asymmetrical sectional shape with respect to an arbitrary axis perpendicular to the mask surface.

2. A mask according to claim 1, wherein the mask has such a structure that the light for exposure is incident from a first surface side of the mask and an optical electrical field is generated from a second surface side of the mask, and the asymmetrical sectional shape of the mask has at least one acute vertex in the neighborhood of the second surface side of the mask.

3. A mask according to claim 1, wherein the asymmetrical sectional shape is a substantially polygonal shape selected from the group consisting of a substantial triangle, a substantial rectangle, and a substantial parallelogram.

4. A near-field light generating method, comprising:

providing a near-field exposure mask having a mask base material and a light blocking layer formed on the base material, the light blocking layer comprising a fine metal structure or a fine opening formed in the light blocking layer, wherein the size of the metal structure or the size of the fine opening is not more than a wavelength of light for exposure, and at least one of a cross section of the fine metal structure in a direction perpendicular to a surface of the mask and a cross section of the fine opening in a direction perpendicular to the mask has an asymmetrical sectional shape with respect to an arbitrary axis perpendicular to the mask surface; and creating at least one of an electrical field concentration, interference of surface plasmon polariton waves, and plasma oscillation in an asymmetrical system including the asymmetrical sectional shape to generate intense near-field light in the neighborhood of a vertex of the asymmetrical sectional shape of the mask.

5. A method according to claim 4, wherein the interference of surface plasmon polariton waves is created so that a difference in an effective propagation distance between a surface plasmon polariton wave propagated from one side in the asymmetrical system and a surface plasmon polariton wave propagated from the other side opposite from the one side is an odd integral of a substantial half-wavelength of the surface plasmon polariton wave.

6. A method according to claim 4, wherein the intense near-field light is generated in the neighborhood of the vertex of the asymmetrical sectional shape of the mask by the plasma oscillation.

7. A near-field light generating structure, comprising:

a light blocking metal layer comprising a fine opening having a size of not more than a wavelength of polarization-controlled light incident from a light source and a metal piece disposed in the fine opening, wherein the metal piece has a sectional shape in a plane including a plane of polarization of the incident light, which is asymmetrical with respect to a center line of the fine opening.

8. A structure according to claim 7, wherein the metal piece has first and second vertexes in the neighborhood of a light-incident surface and a third vertex in the neighborhood of a surface, opposite from the light-incident surface, where an optical electric field is created, the metal piece having a phase difference $\beta$ represented by the following equation (2):

$$\beta = (c-d)/\Lambda \times 2\pi \tag{2},$$

wherein c represents an effective propagation distance of a surface plasmon polariton wave in view of an effective refractive index from the first vertex to the third vertex, d represents an effective propagation distance of surface plasmon polariton wave in view of an effective refractive index from the second vertex to the third vertex, and $\lambda$ represents a wavelength of the surface plasmon polariton wave.

9. A near-field light generating structure, comprising:

a light blocking metal layer comprising a fine opening having a size of not more than a wavelength of polarization-controlled light incident from a light source and a metal piece disposed in the fine opening, wherein the light blocking metal layer has a periodic surface unevenness for exciting a surface plasmon polariton wave and the fine opening is formed at a center position where a sectional shape of the periodic surface unevenness in a plane including a plane of polarization of the incident light is symmetrical with respect to a propagating direction of the light or at a position shifted from the center position, and wherein the metal piece has an asymmetrical sectional shape with respect to a center line of the fine opening in a plane including a plane of polarization of the incident light when the fine opening is formed at the center position and the metal piece has a symmetrical or an asymmetrical sectional shape when the fine opening is formed at the shifted position.

10. A structure according to claim 9, wherein the periodic surface unevenness of the light blocking metal layer has a period substantially equal to a wavelength of surface plasmon polariton wave excited at the surface of the light blocking metal layer.

11. A structure according to claim 9, wherein the periodic surface unevenness has a phase difference $\alpha$ represented by the following equation (1):

$$\alpha = (a-b)/\Lambda \times 2\pi \tag{1}$$

wherein a represents a distance between an end surface and a starting point of a period structure on one side with respect to a center line of the fine opening, b represents a distance between an end surface and a starting point of a periodic structure on the other side with respect to the center line of the fine opening and $\Lambda$ represents a pitch of the periodic surface unevenness.

12. A structure according to claim 11, wherein the phase difference $\alpha$ of the periodic surface unevenness satisfies an equation (3) shown below and the metal piece has a phase difference $\beta$ satisfying an equation (4) shown below:

$$\alpha = (2m+1)\pi \tag{3},$$

$$\beta = (2n+1)\pi \tag{4},$$

wherein m and n are an integer.

13. A near-field exposure apparatus, comprising:

a near-field exposure mask having a mask base material and a light blocking layer formed on the base material, the light blocking layer comprising a fine metal structure or a fine opening formed in the light blocking layer, wherein the size of the metal structure or the size of the fine opening is not more than a wavelength of light for exposure, and at least one of a cross section of the fine metal structure in a direction perpendicular to the surface of the mask and a cross section of the fine opening in a direction perpendicular to the mask has an asymmetrical sectional shape with respect to an arbitrary axis perpendicular to the mask surface; and an exposure light source.

* * * * *

UNITED STATES PATENT AND TRADEMARK OFFICE
CERTIFICATE OF CORRECTION

PATENT NO. : 7,279,253 B2
APPLICATION NO. : 10/936806
DATED : October 9, 2007
INVENTOR(S) : Tomohiro Yamada et al.

It is certified that error appears in the above-identified patent and that said Letters Patent is hereby corrected as shown below:

COLUMN 6:
  Line 1, "a near-field exposure" should be deleted.
  Line 2, "mask manufacturing method," should be deleted.

COLUMN 8:
  Line 39, "vie" should read -- view --.

COLUMN 10:
  Line 35, "in" should be deleted.

COLUMN 11:
  Line 48, "+1  st" should read -- +1st --.

COLUMN 12:
  Line 50, "light, in the fine opening" should read -- light in the fine opening, --.

COLUMN 16:
  Line 35, "ad" should be deleted.

COLUMN 18:
  Line 41, "in" should be deleted.

COLUMN 20:
  Line 33, "is" should be deleted.

UNITED STATES PATENT AND TRADEMARK OFFICE
CERTIFICATE OF CORRECTION

PATENT NO. : 7,279,253 B2
APPLICATION NO. : 10/936806
DATED : October 9, 2007
INVENTOR(S) : Tomohiro Yamada et al.

It is certified that error appears in the above-identified patent and that said Letters Patent is hereby corrected as shown below:

COLUMN 21:
Line 54, "$\beta = (c - d) / \Lambda \times 2\pi$" should read -- $\beta = (c - d) / \lambda \times 2\pi$ --.

Signed and Sealed this

Thirteenth Day of May, 2008

JON W. DUDAS
*Director of the United States Patent and Trademark Office*